(12) United States Patent
Sharangpani et al.

(10) Patent No.: US 12,745,620 B2
(45) Date of Patent: Sep. 22, 2026

(54) THREE-DIMENSIONAL MEMORY DEVICE INCLUDING CAPPED MOLYBDENUM WORD LINES AND METHOD OF MAKING THE SAME

(71) Applicant: SANDISK TECHNOLOGIES LLC, Addison, TX (US)

(72) Inventors: Rahul Sharangpani, Fremont, CA (US); Raghuveer S. Makala, Campbell, CA (US); Kartik Sondhi, Milpitas, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 1016 days.

(21) Appl. No.: 17/808,333

(22) Filed: Jun. 23, 2022

(65) Prior Publication Data

US 2023/0420370 A1 Dec. 28, 2023

(51) Int. Cl.
*H10W 20/42* (2026.01)
*H10B 41/27* (2023.01)
(Continued)

(52) U.S. Cl.
CPC .......... *H10W 20/425* (2026.01); *H10B 41/27* (2023.02); *H10B 43/27* (2023.02); *H10W 20/20* (2026.01)

(58) Field of Classification Search
CPC ...... H10D 88/01; H10D 88/00; H10D 88/101; H10D 84/983–988; H10D 62/121; H10D 30/024; H10D 30/62; H10D 30/6735; H10D 30/794; H10D 30/797; H10D 62/115; H10D 62/151; H10D 62/292; H10D 62/822; H10D 64/017; H10D 64/021; H10D 64/257; H10D 64/62; H10D 30/014; H10D 30/0323; H10D 30/43; H10D 30/6744; H10D 30/6757; H10D 64/251; H10D 62/116; H10D 62/364; H10B 20/40–65; H10B 53/20;
(Continued)

(56) References Cited

U.S. PATENT DOCUMENTS 9,356,034 B1 5/2016 Yada et al.
9,496,419 B2 11/2016 Sharangpani et al.
(Continued)

OTHER PUBLICATIONS

Endoh et al., "Novel Ultra High-Density Memory with a Stacked-Surrounding Gate Transistor (S-SGT) Structured Cell," IEDM Proc. (2001) 33-36.

(Continued)

*Primary Examiner* — Moin M Rahman
(74) *Attorney, Agent, or Firm* — THE MARBURY LAW GROUP PLLC

(57) ABSTRACT

A three-dimensional memory device includes an alternating stack of insulating layers and electrically conductive layers, memory openings vertically extending through the alternating stack, and memory opening fill structures located within the memory openings. Each of the memory opening fill structures includes a respective vertical semiconductor channel and a respective vertical stack of memory elements. Each of the electrically conductive layers include a molybdenum layer and a plurality of conductive capping material portions in contact with an outer sidewall of a respective one of the memory opening fill structures.

5 Claims, 38 Drawing Sheets

(51) Int. Cl.

| | |
|---|---|
| ***H10B 43/27*** | (2023.01) |
| ***H10W 20/20*** | (2026.01) |
| ***H10W 20/41*** | (2026.01) |

(58) Field of Classification Search

CPC ........ H10B 41/20–27; H10B 43/20–27; H10B 51/20; H10B 63/84–845; H10B 41/27; H10B 43/27; H10B 43/10; H10B 43/50; H10B 41/30; H10B 43/30; H10B 43/40; H10B 41/35; H10B 41/50; H10B 43/35; H10B 41/41; H10B 41/10; H10B 41/40; H01L 21/02532; H01L 21/02603; H01L 21/28568; H01L 21/30604; H01L 25/105; H01L 21/30625; H01L 21/6835; H01L 23/53266; H01L 23/528; H01L 49/41775; H01L 29/42324; H01L 29/4234; H01L 23/535; H01L 23/5226; H01L 29/41775; H01L 21/02636; H01L 21/31111; H01L 21/31155; H01L 21/76802; H01L 21/76877; H01L 21/76897; H01L 29/40114; H01L 29/40117; H01L 29/66545; H01L 29/7883; H01L 21/76831; H01L 21/76805; H01L 29/78; H10W 20/425; H10W 20/20

See application file for complete search history.

(56) References Cited

U.S. PATENT DOCUMENTS 9,570,455 B2 2/2017 Sharangpani et al.
9,613,977 B2 4/2017 Sharangpani et al.
9,659,955 B1 5/2017 Sharangpani et al.
9,659,956 B1 5/2017 Sharangpani et al.
9,698,152 B2 7/2017 Peri et al.
9,698,223 B2 7/2017 Sharangpani et al.
9,768,270 B2 9/2017 Gunji-Yoneoka et al.
9,780,182 B2 10/2017 Peri et al.
9,875,929 B1 1/2018 Shukla et al.
9,984,963 B2 5/2018 Peri et al.
10,283,513 B1 5/2019 Zhou et al.
10,438,964 B2 10/2019 Makala et al.
10,651,196 B1 * 5/2020 Sharangpani ..... H01L 21/76879
10,707,233 B1 7/2020 Cui et al.
10,741,572 B2 8/2020 Sharangpani et al.
10,804,282 B2 10/2020 Baraskar et al.
10,818,542 B2 10/2020 Cui et al.
10,840,259 B2 11/2020 Rabkin et al.
10,861,896 B2 12/2020 Nakamura et al.
10,961,504 B2 3/2021 Reisner et al.
11,049,807 B2 6/2021 Li et al.
11,063,063 B2 7/2021 Zhang et al.
11,101,288 B2 8/2021 Zhang et al.
11,177,280 B1 11/2021 Rajashekhar et al.
11,244,953 B2 2/2022 Kanakamedala et al.
11,289,416 B2 3/2022 Tsutsumi et al.
2015/0380419 A1 12/2015 Gunji-Yoneoka et al.
2016/0149002 A1 5/2016 Sharangpani et al.
2016/0225866 A1 8/2016 Peri et al.
2016/0329343 A1 * 11/2016 Pachamuthu .......... H10B 41/27
2016/0351497 A1 12/2016 Peri et al.
2016/0379989 A1 12/2016 Sharangpani et al.
2017/0125436 A1 5/2017 Sharangpani et al.
2017/0352669 A1 12/2017 Sharangpani et al.
2018/0090373 A1 * 3/2018 Sharangpani ....... H10W 20/057
2018/0374866 A1 12/2018 Makala et al.
2019/0139973 A1 5/2019 Zhou et al.
2020/0020715 A1 1/2020 Nakamura et al.
2020/0051993 A1 2/2020 Rabkin et al.
2020/0365618 A1 * 11/2020 Zhang .................... H10B 51/20
2020/0395310 A1 12/2020 Mukae et al.
2021/0159167 A1 5/2021 Tsutsumi et al.
2021/0183882 A1 * 6/2021 Zhang .................... H10B 43/27
2021/0265372 A1 8/2021 Kanakamedala et al.
2021/0265385 A1 8/2021 Rajashekhar et al.
2021/0335805 A1 10/2021 Kai et al.
2021/0335999 A1 10/2021 Kai et al.
2022/0059462 A1 2/2022 Said et al.
2022/0109003 A1 4/2022 Nagahata et al.
2023/0290721 A1 * 9/2023 Greenlee ................ H10B 41/27

OTHER PUBLICATIONS

Hsu, C. C. et al., "Etching of ruthenium coatings in O2O2- and Cl2Cl2-containing plasmas," Journal of Vacuum Science & Technology A 24, 1 (2006); https://doi.org/10.1116/1.2121751.

Yellareddy, K. et al., "Structural and electrical properties of RuO2 thin films prepared by rf-magnetron sputtering and annealing at different temperatures," *Journal of Materials Science: Materials in Electronics* vol. 17, No. 12, pp. 1029-1034, (2006) DOI:10.1007/s10854-006-9032-4.

U.S. Appl. No. 17/155,541, filed Jan. 22, 2021, SanDisk Technologies LLC.

U.S. Appl. No. 17/192,603, filed Mar. 4, 2021, SanDisk Technologies LLC.

U.S. Appl. No. 17/192,668, filed Mar. 4, 2021, SanDisk Technologies LLC.

U.S. Appl. No. 17/244,186, filed Apr. 29, 2021, SanDisk Technologies LLC.

U.S. Appl. No. 17/317,442, filed May 11, 2021, SanDisk Technologies LLC.

U.S. Appl. No. 17/345,831, filed Jun. 11, 2021, SanDisk Technologies LLC.

U.S. Appl. No. 17/345,860, filed Jun. 11, 2021, SanDisk Technologies LLC.

U.S. Appl. No. 17/348,305, filed Jun. 15, 2021, SanDisk Technologies LLC.

U.S. Appl. No. 17/348,328, filed Jun. 15, 2021, SanDisk Technologies LLC.

U.S. Appl. No. 17/351,756, filed Jun. 18, 2021, SanDisk Technologies LLC.

U.S. Appl. No. 17/351,789, filed Jun. 18, 2021, SanDisk Technologies LLC.

U.S. Appl. No. 17/351,811, filed Jun. 18, 2021, SanDisk Technologies LLC.

U.S. Appl. No. 17/378,196, filed Jul. 16, 2021, SanDisk Technologies LLC.

U.S. Appl. No. 17/406,493, filed Aug. 19, 2021, SanDisk Technologies LLC.

U.S. Appl. No. 17/587,470, filed Jan. 28, 2022, SanDisk Technologies LLC.

U.S. Appl. No. 17/587,518, filed Jan. 28, 2022, SanDisk Technologies LLC.

U.S. Appl. No. 17/663,055, filed May 12, 2022, SanDisk Technologies LLC.

* cited by examiner 50
501 502 54 56
601
46
46C
46M
70
32
49'
10

55
60
60L
50
501 502
54
56
46
46C
46M
63
62
58
70
32
10

50
501 502 54 56
70
46M
32
46C
46
10
49'

THREE-DIMENSIONAL MEMORY DEVICE INCLUDING CAPPED MOLYBDENUM WORD LINES AND METHOD OF MAKING THE SAME

FIELD

The present disclosure relates generally to the field of semiconductor devices, and particularly to a three-dimensional memory device including capped molybdenum word lines and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers; memory openings vertically extending through the alternating stack; and memory opening fill structures located within the memory openings, wherein: each of the memory opening fill structures comprises a respective vertical semiconductor channel and a respective vertical stack of memory elements, and each of the electrically conductive layers comprise a molybdenum layer and a plurality of conductive capping material portions which comprise a material other than molybdenum and which are in contact with an outer sidewall of a respective one of the memory opening fill structures.

According to another aspect of the present disclosure, a method of forming a three-dimensional memory device is provided, which comprises: forming a combination of an alternating stack of insulating layers and molybdenum layers and memory openings vertically extending through the alternating stack over a substrate; selectively forming a vertical stack of conductive capping material portions within each of the memory openings directly on physically exposed surfaces of the molybdenum layers; and forming a memory opening fill structure within each of the memory openings, wherein the memory opening fill structure comprises a vertical semiconductor channel and memory film comprising a metal oxide blocking dielectric layer located in contact with the vertical stack of conductive capping material portions.

According to another aspect of the present disclosure, a method of forming a three-dimensional memory device is provided, which comprises: forming a combination of an alternating stack of insulating layers and silicon nitride sacrificial material layer and memory openings vertically extending through the alternating stack over a substrate; selectively forming a vertical stack of ruthenium capping material portions within each of the memory openings directly on physically exposed surfaces of the sacrificial material layers; forming a memory opening fill structure within each of the memory openings, wherein the memory opening fill structure comprises a vertical semiconductor channel and a memory film comprising a metal oxide blocking dielectric layer located in contact with the vertical stack of conductive capping material portions; and replacing the sacrificial material layers with molybdenum layers which contact the vertical stack of ruthenium capping material portions.

DETAILED DESCRIPTION

Figure 1:
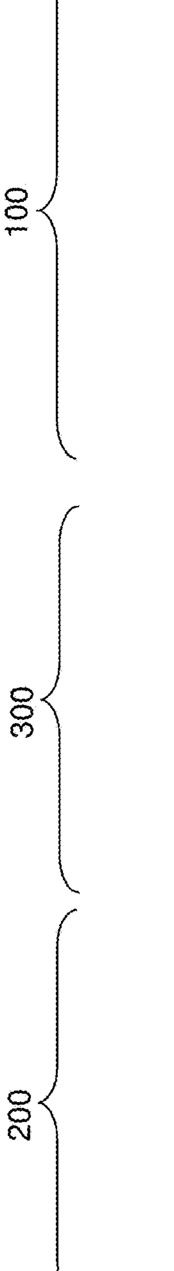
FIG. 1 is a schematic vertical cross-sectional view of a first exemplary structure after formation of at least one peripheral device according to an embodiment of the present disclosure.
Figure 1:
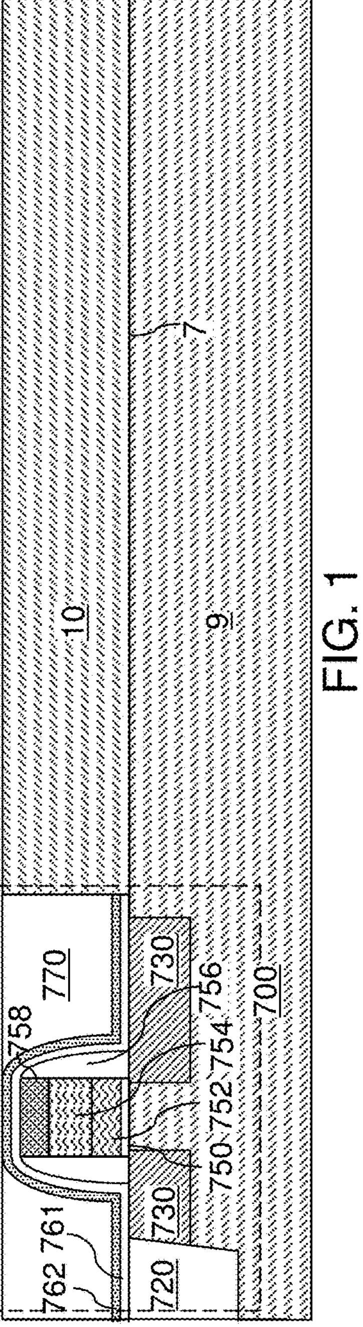

As discussed above, the present disclosure is directed to a three-dimensional memory device including capped molybdenum word lines and methods of manufacturing the same, the various aspects of which are described below. The embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer (e.g., silicon wafer) 9 and an optional semiconductor material layer (e.g., doped well or epitaxial layer) 10. The substrate can have a major surface 7, which can be, for example, a topmost surface of the substrate semiconductor layer 9. In one embodiment, the major surface 7 can be a single crystalline semiconductor surface, such as a single crystalline silicon surface.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors.

A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device. A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a topmost surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
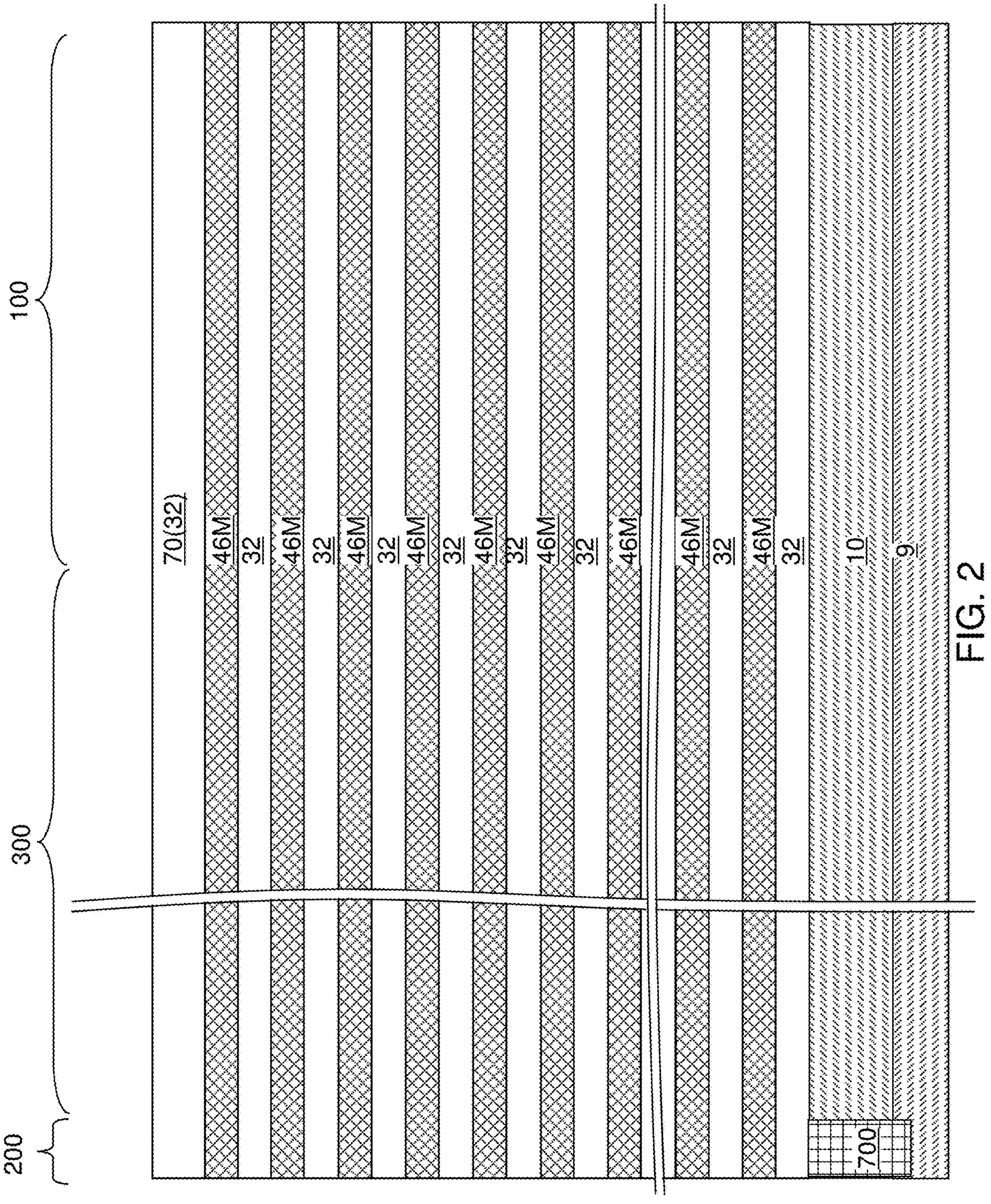
FIG. 2 is a schematic vertical cross-sectional view of the first exemplary structure after formation of an alternating stack of insulating layers and molybdenum layers according to an embodiment of the present disclosure.

Referring to FIG. 2, a stack of an alternating plurality of insulating layers 32 and molybdenum layers 46M is formed over the top surface of the substrate (9, 10). The alternating plurality of the insulating layers 32 and the molybdenum layers 46M may begin with an instance of the insulating layers 32, and may end with an instance of the insulating layers 32, which is herein referred to as an insulating cap layer 70.

Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the insulating layers 32 may be silicon oxide layers formed by decomposition of tetraethyl orthosilicate (TEOS) in a chemical vapor deposition process.

The molybdenum layers 46M may be deposited by chemical vapor deposition by thermal decomposition of a precursor gas including molybdenum and fluorine such as molybdenum hexafluoride. Alternatively, the molybdenum layers 46M may be formed by physical vapor deposition.

The thicknesses of the insulating layers 32 and the molybdenum layers 46M can be in a range from 20 nm to 50 nm, although lesser and greater thicknesses can be employed for each insulating layer 32 and for each molybdenum layer 46M. The number of repetitions of the pairs of an insulating layer 32 and a molybdenum layer 46M can be in a range from 2 to 1,024, and typically from 8 to 256, although a greater number of repetitions can also be employed. In one embodiment, each molybdenum layer 46M in the alternating stack (32, 46M) can have a uniform thickness throughout.

Figure 3A:
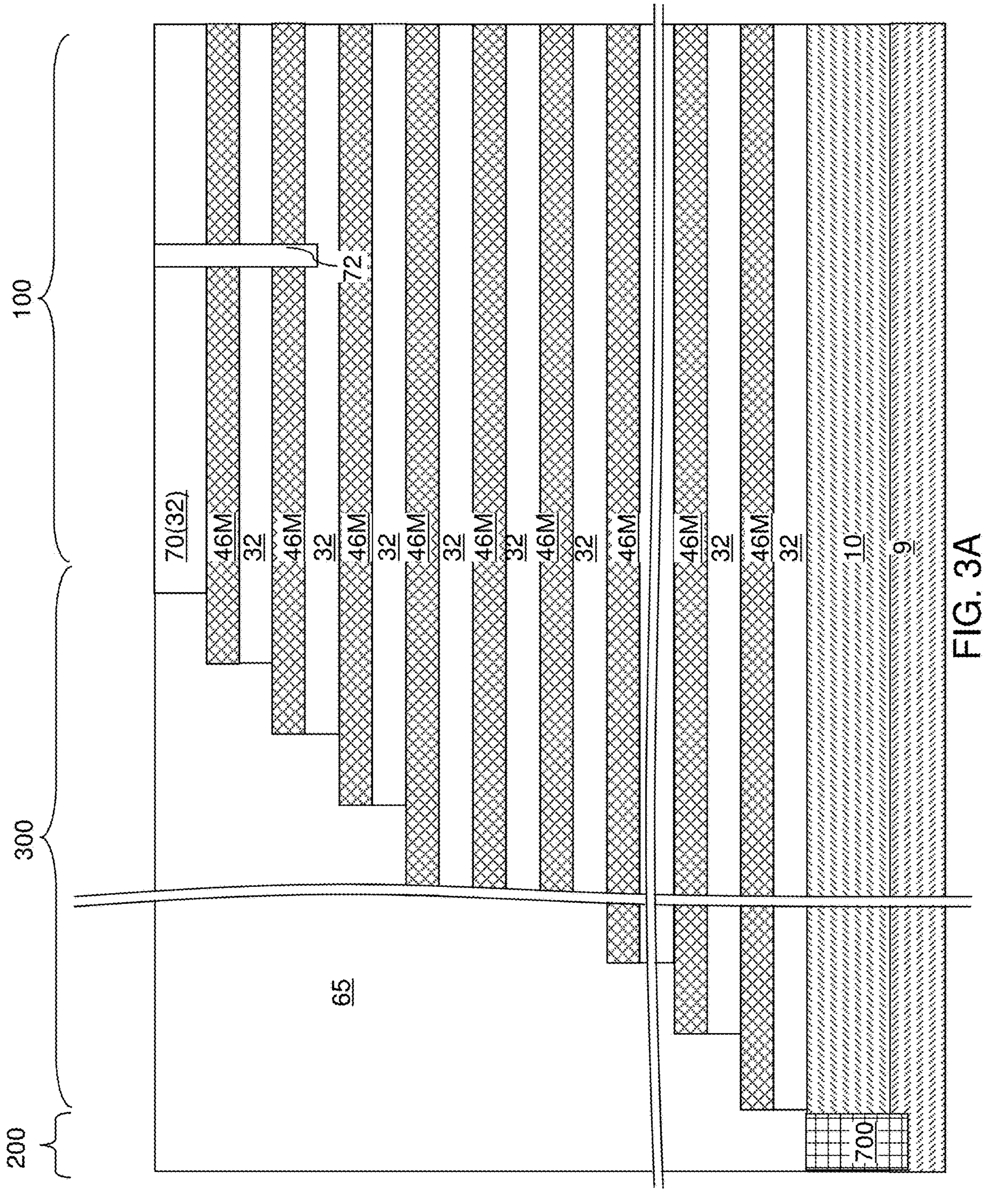
FIG. 3A is a schematic vertical cross-sectional view of the first exemplary structure after formation of stepped terraces, a retro-stepped dielectric material portion, and drain-select-level isolation structures according to an embodiment of the present disclosure.
Figure 3B:
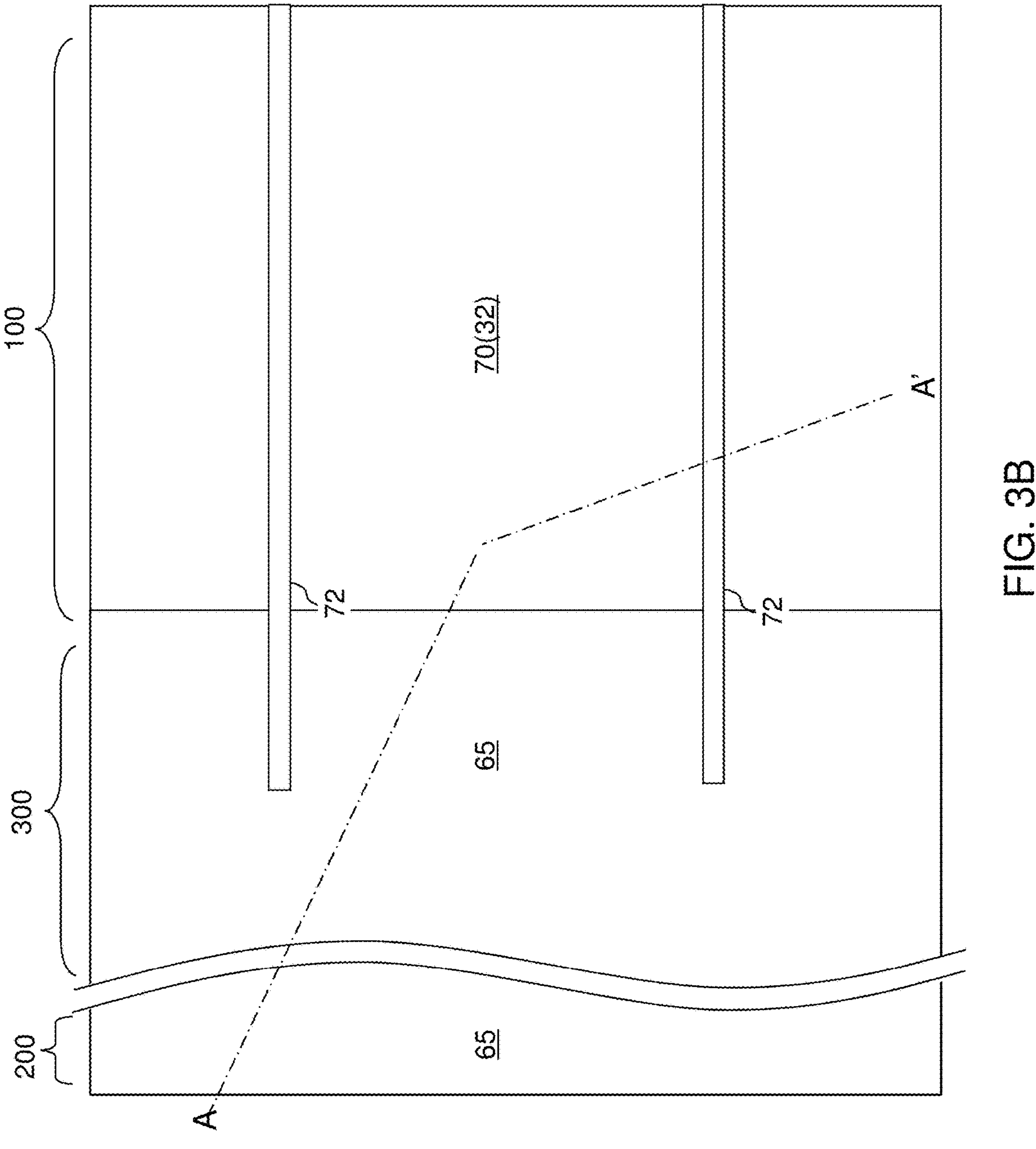
FIG. 3B is a top-down view of the first exemplary structure of FIG. 3A. The vertical plane A-A' is the plane of the cross-section for FIG. 3A.

Referring to FIGS. 3A and 3B, stepped surfaces are formed in the contact region 300. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 46M) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each molybdenum layer 46M other than a topmost molybdenum layer 46M within the alternating stack (32, 46M) laterally extends farther than any overlying molybdenum layer 46M within the alternating stack (32, 46M) in the terrace region. The terrace region includes stepped surfaces of the alternating stack (32, 46M) that continuously extend from a bottommost layer within the alternating stack (32, 46M) to a topmost layer within the alternating stack (32, 46M).

Each vertical step of the stepped surfaces can have the height of one or more pairs of an insulating layer 32 and a molybdenum layer 46M. In one embodiment, each vertical step can have the height of a single pair of an insulating layer 32 and a molybdenum layer 46M. In another embodiment, multiple "columns" of staircases can be formed along a first horizontal direction hd1 such that each vertical step has the height of a plurality of pairs of an insulating layer 32 and a molybdenum layer 46M, and the number of columns can be at least the number of the plurality of pairs. Each column of staircase can be vertically offset among one another such that each of the molybdenum layers 46M has a physically exposed top surface in a respective column of staircases. In the illustrative example, two columns of staircases are formed for each block of memory stack structures to be subsequently formed such that one column of staircases provide physically exposed top surfaces for odd-numbered molybdenum layers 46M (as counted from the bottom) and another column of staircases provide physically exposed top surfaces for even-numbered molybdenum layers (as counted from the bottom). Configurations employing three, four, or more columns of staircases with a respective set of vertical offsets among the physically exposed surfaces of the molybdenum layers 46M may also be employed. Each molybdenum layer 46M has a greater lateral extent, at least along one direction, than any overlying molybdenum layers 46M such that each physically exposed surface of any molybdenum layer 46M does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion

65, then the silicon oxide of the retro-stepped dielectric material portion 65 may or may not be doped with dopants such as B, P, and/or F.

Optionally, drain-select-level isolation structures 72 can be formed through the insulating cap layer 70 and a subset of the molybdenum layers 46M located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
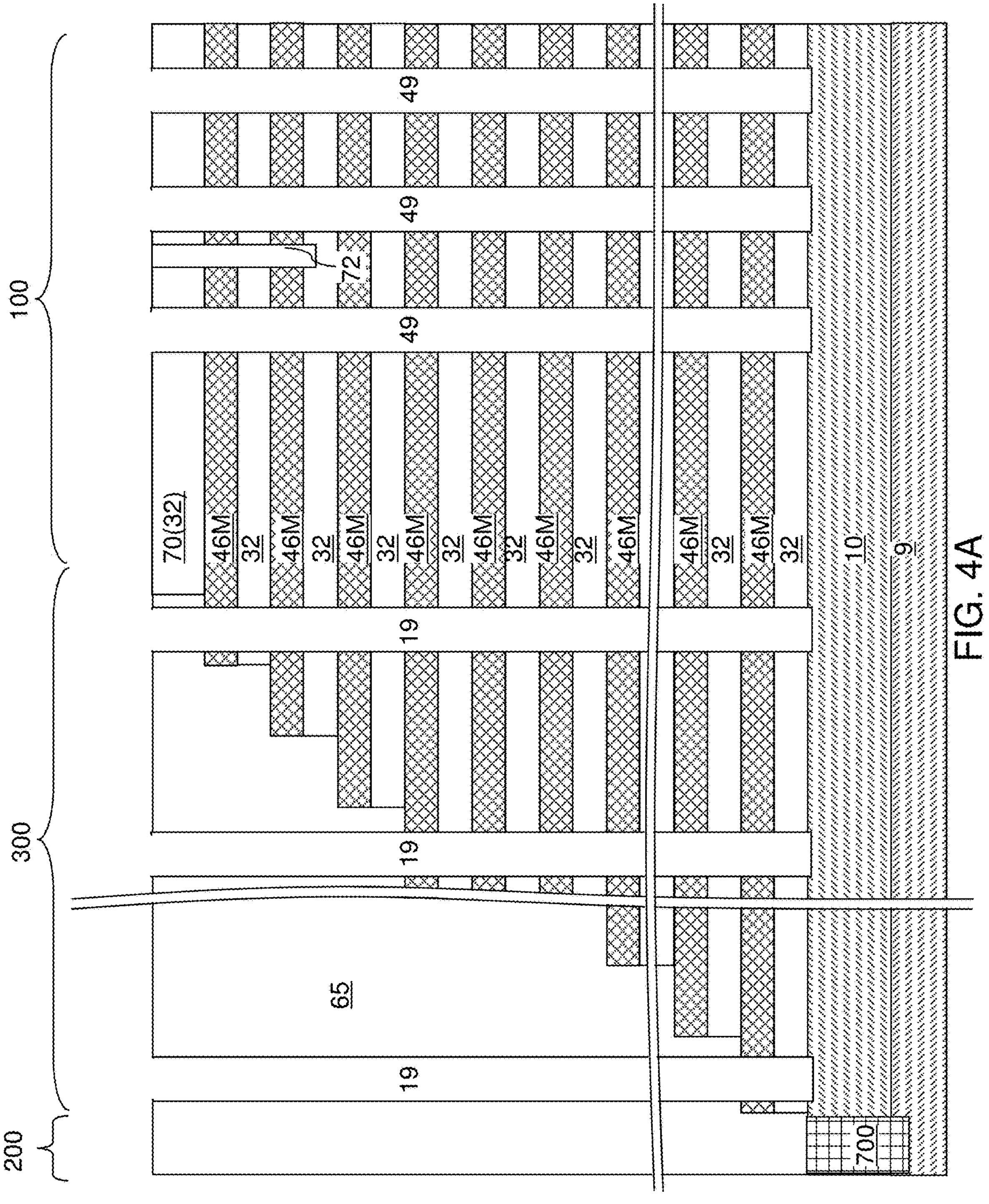
FIG. 4A is a schematic vertical cross-sectional view of the first exemplary structure after formation of memory openings and support openings according to an embodiment of the present disclosure.
Figure 4B:
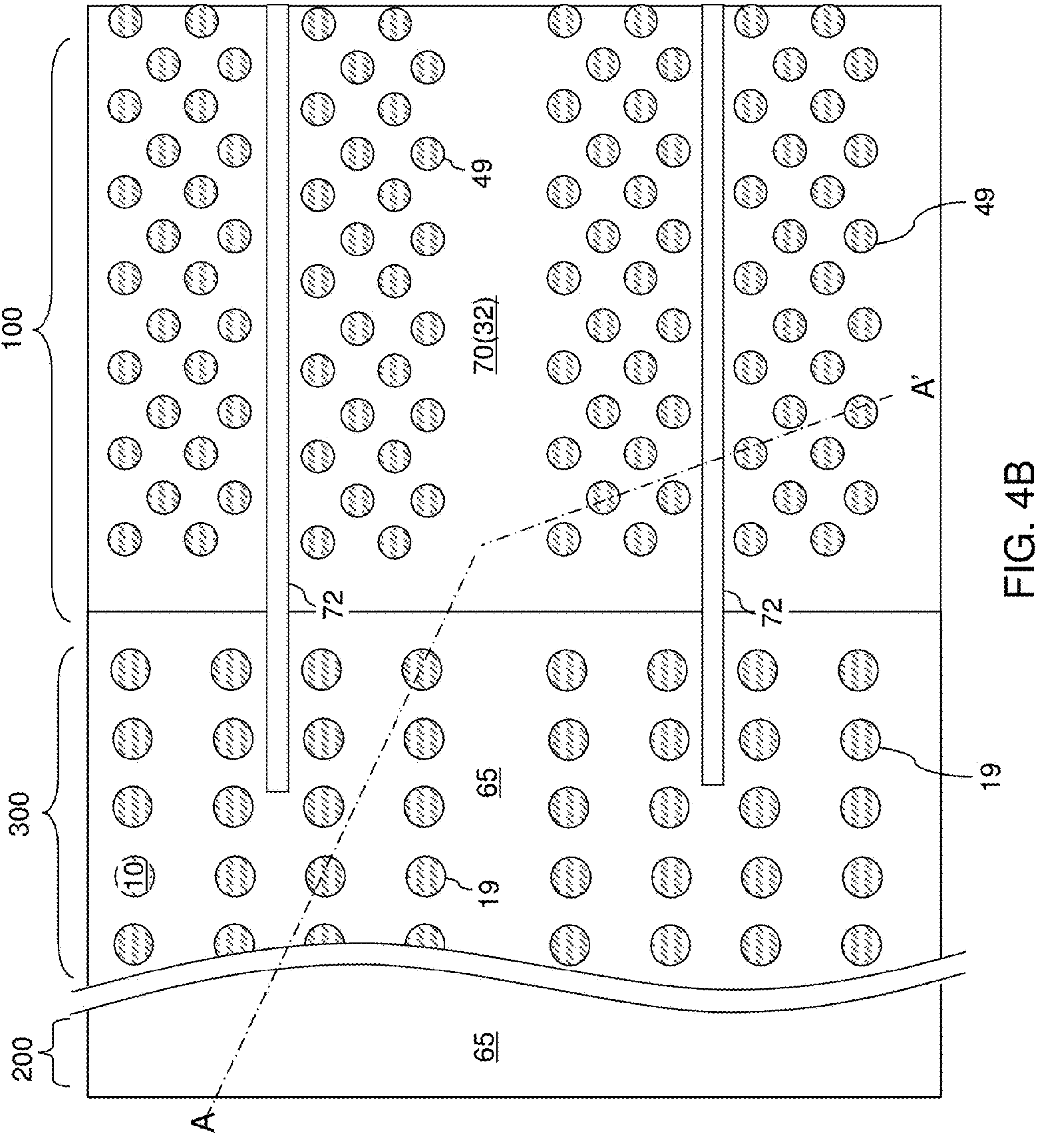
FIG. 4B is a top-down view of the first exemplary structure of FIG. 4A. The vertical plane A-A' is the plane of the cross-section for FIG. 4A.

Referring to FIGS. 4A and 4B, a patterned etch mask layer including an array of openings can be formed over the alternating stack (32, 46M), and an anisotropic etch process can be performed to transfer a pattern of the array of opening in the patterned etch mask layer through the alternating stack (32, 46M). For example, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 46M) by at least one anisotropic etch that employs the patterned lithographic material stack as an etch mask. Portions of the alternating stack (32, 46M) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 46M) in the memory array region 100. The support openings 19 are formed through the retro-stepped dielectric material portion 65 and the portion of the alternating stack (32, 46M) that underlie the stepped surfaces in the contact region 300.

The memory openings 49 extend through the entirety of the alternating stack (32, 46M). The support openings 19 extend through a subset of layers within the alternating stack (32, 46M). The chemistry of the anisotropic etch process employed to etch through the materials of the alternating stack (32, 46M) can alternate to optimize etching of the first and second materials in the alternating stack (32, 46M). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 46M) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

Figure 5A:
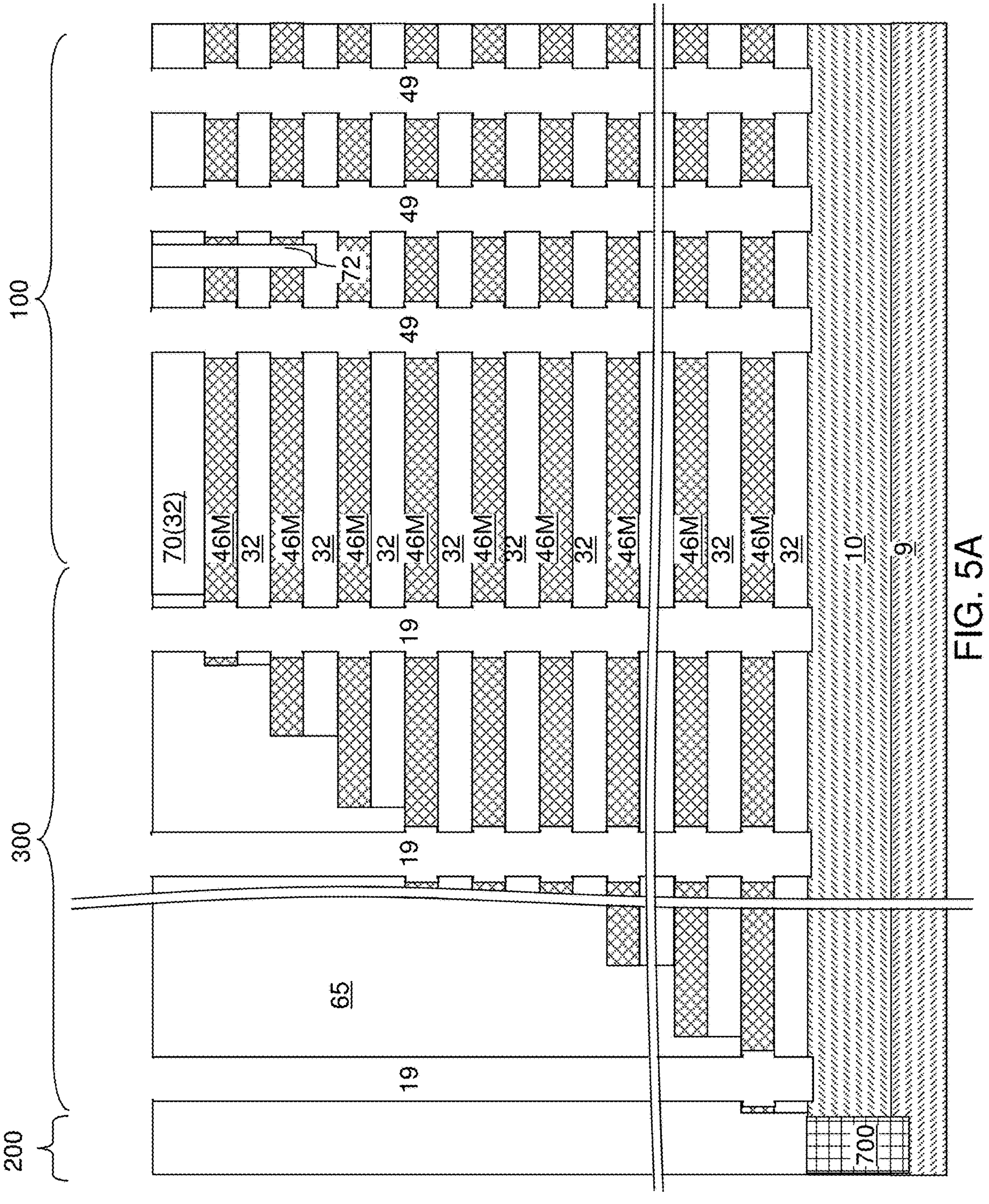
FIG. 5A is a vertical cross-sectional view of the first exemplary structure after laterally recessing the molybdenum layers according to an embodiment of the present disclosure.
Figure 5B:
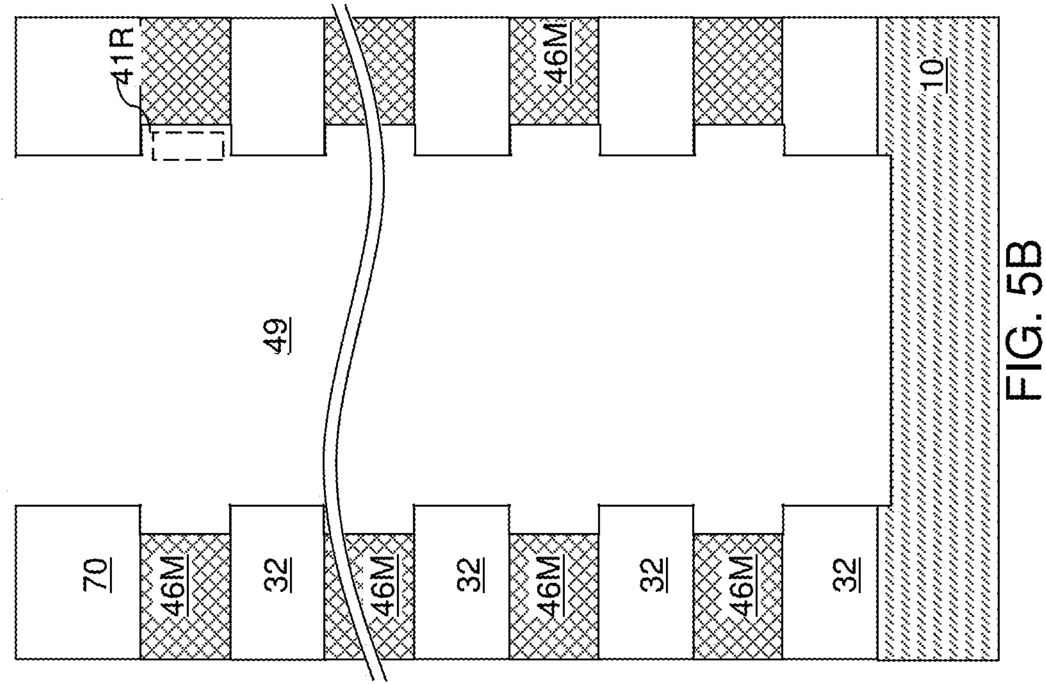
FIG. 5B is a magnified view of a memory opening in the first exemplary structure of FIG. 5A.

Referring to FIGS. 5A and 5B, an isotropic etch may be optionally performed to isotropically recess physically exposed surfaces of the molybdenum layers 46M around the memory openings 49 and the support openings 19. For example, a wet etch process having an etch chemistry that etches molybdenum selective to the insulating material of the insulating layers 32 and the retro-stepped dielectric material portion 65 can be performed to laterally recess physically exposed sidewalls of the molybdenum layers 46M around the memory openings 49 and the support openings 19. A lateral recess 41R can be formed in each volume from which a respective portion of the molybdenum layers 46M is removed by the isotropic etch process. Each lateral recess 41R around a memory opening 49 may have a tubular configuration. The lateral recess distance of the isotropic etch process may be in a range from 3 nm to 100 nm, such as from 6 nm to 30 nm, although lesser and greater recess distances may also be employed. A vertical stack of lateral recesses 41R can be formed around each memory opening 49. The lateral recesses 41R within each vertical stack of lateral recesses 41R around a memory opening 49 can be formed at each level of the molybdenum layers 46M.

FIGS. 6A-6H are sequential vertical cross-sectional views of a memory opening 49 during formation of conductive capping material portions 46C and a memory opening fill structure 58 having a first configuration according to an embodiment of the present disclosure.

Figures 6A, 6B:
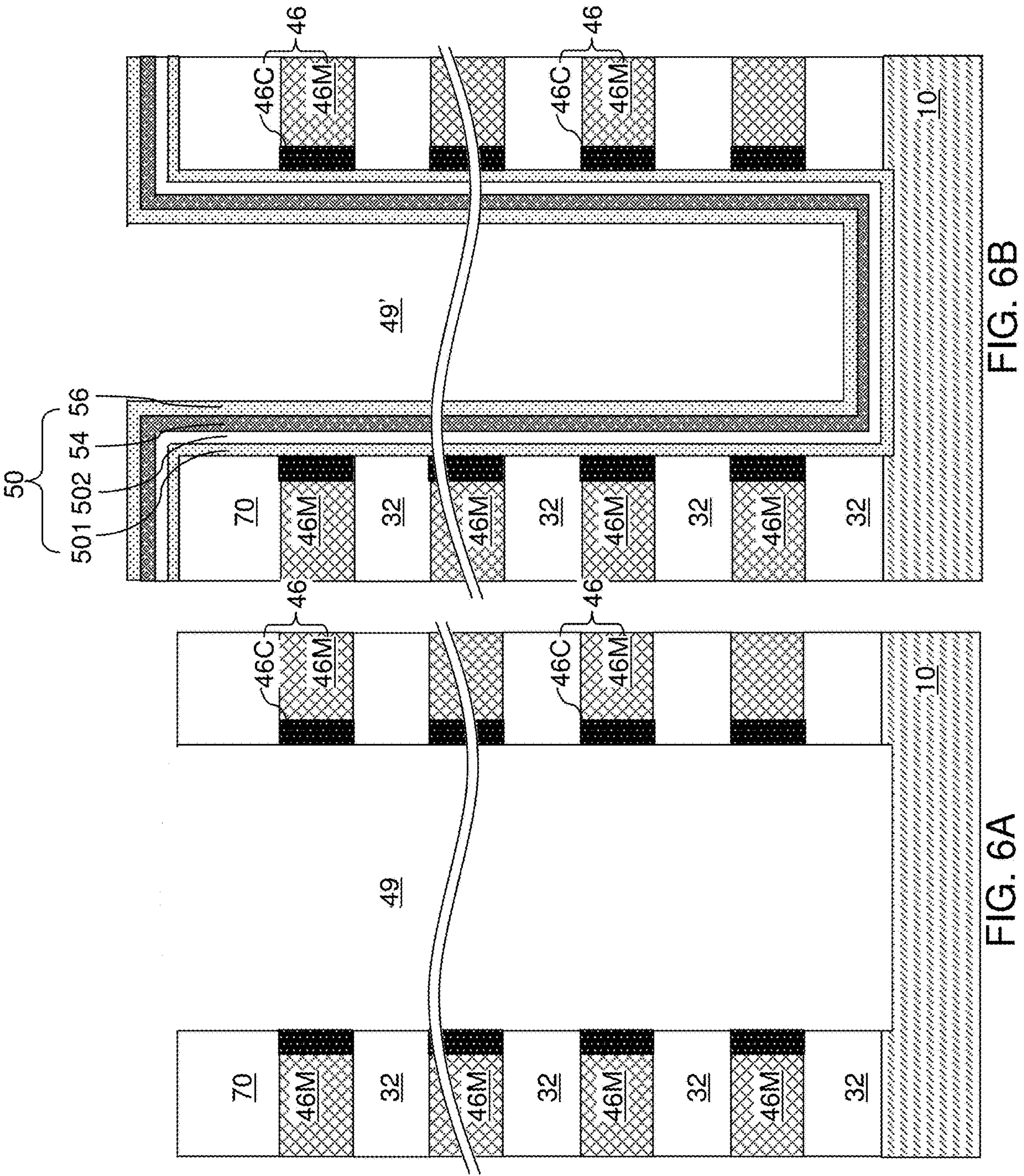
FIGS. 6A-6H are sequential vertical cross-sectional views of a memory opening during formation of conductive capping material portions and a memory opening fill structure having a first configuration according to an embodiment of the present disclosure.

Referring to FIG. 6A, a metal can be deposited on physically exposed surfaces of the molybdenum layers 46M in each of the lateral recesses 41R around the memory openings 49 and the support openings 19. In one embodiment, the metal can be selectively deposited on metallic surfaces, such as surfaces of the molybdenum layers 46M, without nucleating on the surfaces of the insulating layers 32. An area selective conductive material deposition process can be performed to form portions of the metal on the physically exposed surfaces of the molybdenum layers 46M. The area selective conductive material deposition process grows portions of the metal on physically exposed surfaces of the molybdenum layers 46M while suppressing growth of the metal on physically exposed surfaces of the insulating layers 32.

In this case, a chemical vapor deposition (CVD) or an atomic layer deposition (ALD) selective area deposition process can be performed to deposit portions of the elemental metal in the lateral recesses 41R. A vertical stack of metal portions can be formed around the memory openings 49 and the support openings 19 directly on physically exposed surfaces of the molybdenum layers 46M. In one embodiment, the metal portions may comprise and/or may consist essentially of a transition metal, such as ruthenium or tungsten.

In one embodiment, the metal portions formed in the lateral recesses 41R constitute conductive capping material portions 46C that consist essentially of an elemental metal. In this case, the conductive capping material portions 46C consist essentially of a metal selected from ruthenium or tungsten. In one embodiment, a vertical stack of conductive capping material portions 46C can be formed around each memory opening 49. The conductive capping material portions 46C can be located at each level of the molybdenum layers 46M. Each of the conductive capping material potions 46C may have a tubular configuration, and may have a uniform lateral thickness between a respective inner sidewall and a respective outer sidewall. The lateral thickness of the conductive capping material portions 46C may be in a range from 3 nm to 100 nm, such as from 6 nm to 30 nm, although lesser and greater thicknesses may also be employed.

In another embodiment, an oxidation process or a nitridation process can be performed to convert the metal portions that are deposited in the lateral recesses 41R into conductive metallic nitride material portions or conductive metallic oxide portions. In this case, the portions of the metal that are grown on the physically exposed surfaces of the molybdenum layers 46M are oxidized or nitrided. Conductive capping material portions 46C are formed in the lateral recesses 41R, which comprise a conductive metal-containing compound material, which is a conductive oxide or a conductive nitride of the metal. In one embodiment, the conductive metal-containing compound material of the conductive capping material portions 46C comprises a conductive metal oxide material or a conductive metal nitride material. In one embodiment, the conductive metal-containing compound material may be selected from ruthenium oxide or tungsten nitride, which are electrically conductive.

A plurality of conductive capping material portions 46C can be formed directly on each molybdenum layer 46M around each of the memory openings 49 and around a respective subset of the support openings 19. Each contiguous combination of a molybdenum layer 46M and at least one conductive capping material portion 46C constitutes an electrically conductive layer 46. A subset of the electrically conductive layers 46 may comprise word lines for a three-dimensional memory array to be subsequently formed. An alternating stack of the insulating layers 32 and the electrically conductive layers 46M can be formed over the substrate (9, 10).

In one embodiment, each of the molybdenum layers 46M is in contact with a respective underlying insulating layer 32 and a respective overlying insulating layer 32 of the insulating layers 32 in the alternating stack (32, 46M). In one embodiment, each of the electrically conductive layers 46 comprise a molybdenum layer 46M and a plurality of conductive capping material portions 46C laterally surrounding a respective one of the memory openings 49 and the support openings 19. In one embodiment, each of the plurality of conductive capping material portions 46C is in contact with a respective underlying insulating layer 32 and a respective overlying insulating layer 32 of the insulating layers 32 in the alternating stack (32, 46M). In one embodiment, each of the plurality of conductive capping material portions 46C is in contact with an annular top surface of the respective underlying insulating layer 32 and is in contact with an annular bottom surface of the respective overlying insulating layer 32.

In an alternative embodiment, a metal may be deposited in the lateral recesses 41R by a non-selective deposition process. In this case, an anisotropic etch process may be performed to etch back portions of the metal that are deposited within volumes that are laterally surrounded by a respective vertical plane that includes all sidewalls of the insulating layers 32 that are physically exposed to a respective one of the memory openings 49 or to a respective one of the support openings 19. In other words, portions of the metal that are not covered by a respective overlying insulating layer 32 can be removed during the anisotropic etch process. In one embodiment, the remaining portions of the metal may constitute the conductive capping material portions 46C. Alternatively, an oxidation process or a nitridation process may be performed to convert portions of the metal into portions of a conductive metal-containing compound material. The conductive metal-containing compound material may be a conductive metal oxide material or a conductive metal nitride material. The portions of the conductive metal-containing compound material constitute the conductive capping material portions 46C.

Generally, the physically exposed inner sidewall surfaces of the conductive capping material portions 46C around a memory opening 49 or a support opening 19 may be vertically coincident with sidewalls of the insulating layers 32 around the memory opening 49 or the support opening 19, or may be recessed outward relative to a cylindrical vertical plane including the sidewalls of the insulating layers 32 around the memory opening 49 or the support opening 19, or may protrude inward from a cylindrical vertical plane including the sidewalls of the insulating layers 32 around the memory opening 49 or the support opening 19. As used herein, a first surface is vertically coincident with a second surface if the second surface overlies or underlies the first surface and if there exists a vertical plane including the first surface and the second surface. Generally, the conductive capping material portions 46C may have a tubular configuration, and may have a respective outer cylindrical sidewall and a respective inner sidewall. The inner sidewall may be a cylindrical sidewall. In case the inner sidewall of a conductive capping material portion 46C protrudes within a cylindrical volume laterally bounded by sidewalls of the insulating layers 32 around a respective memory opening 49, the conductive capping material portion 46C may have a contoured inner sidewall having a straight cylindrical surface segment, a convex annular top surface segment, and a convex annular bottom surface segment.

Referring to FIG. 6B, a stack of layers including at least one blocking dielectric layer (501, 502), a memory material layer 54, and a dielectric material liner 56 can be sequentially deposited in the memory openings 49 and the support openings 19 by a respective conformal deposition process.

The at least one blocking dielectric layer (501, 502) may include a dielectric metal oxide blocking dielectric layer 501 and an optional silicon oxide blocking dielectric layer 502. In one embodiment, the dielectric metal oxide blocking dielectric layer 501 comprises and/or consists essentially of a dielectric metal oxide material having a dielectric constant greater than 7.0. In one embodiment, the dielectric metal oxide blocking dielectric layer 501 may consist essentially of aluminum oxide. The thickness of the dielectric metal oxide blocking dielectric layer 501 may be in a range from 2 nm to 12 nm, such as from 4 nm to 8 nm, although lesser and greater thicknesses may also be employed.

If the conductive capping material portion 46C comprises ruthenium, then ruthenium may be oxidized during deposition of the dielectric metal oxide blocking dielectric layer 501. However, since the resulting ruthenium oxide is electrically conductive, the oxidation does not significantly degrade the conductivity of the electrically conductive layer. If the conductive capping material portion 46C comprises tungsten, then it is typically not oxidized during deposition of the dielectric metal oxide blocking dielectric layer 501. Furthermore, the conductive capping material portion 46C protects the respective molybdenum layer 46M from oxidation during deposition of the dielectric metal oxide blocking dielectric layer 501. Thus, the conductivity of the molybdenum layers is not degraded due to oxidation during the deposition of the dielectric metal oxide blocking dielectric layer 501.

The optional silicon oxide blocking dielectric layer 502 consists essentially of silicon oxide. The thickness of the silicon oxide blocking dielectric layer 502 may be in a range from 2 nm to 12 nm, such as from 4 nm to 8 nm, although lesser and greater thicknesses may also be employed.

Subsequently, the memory material layer 54 can be formed. Generally, the memory material layer may comprise any memory material such as a charge storage material, a ferroelectric material, a phase change material, or any material that can store data bits in the form of presence or absence of electrical charges, a direction of ferroelectric polarization, electrical resistivity, or another measurable physical parameter. In one embodiment, the memory material layer 54 can be a continuous layer or patterned discrete portions of a charge trapping material including a dielectric charge storage material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into molybdenum layers 46M. In one embodiment, the memory material layer 54 includes a silicon nitride layer. A vertical stack of memory elements can be provided within each memory opening 49. The vertical stack of memory elements may comprise portions of the memory material layer 54 that are located at levels of the electrically conductive layers 46. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The dielectric material liner 56 may include a dielectric material through which charge tunneling can be performed under suitable electrical bias conditions. The dielectric material liner 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric material liner 56 may comprise a tunneling dielectric layer. In one embodiment, the tunneling dielectric layer can include a stack of a first silicon oxide layer, a silicon oxynitride layer, and a second silicon oxide layer, which is commonly known as an ONO stack. In one embodiment, the tunneling dielectric layer can include a silicon oxide layer that is substantially free of carbon or a silicon oxynitride layer that is substantially free of carbon. The thickness of the dielectric material liner 56 can be in a range from 2 nm to 20 nm, although lesser and greater thicknesses can also be employed. The combination of the at least one blocking dielectric layer (501, 502), the memory material layer 54, and the dielectric material liner 56 constitutes a memory film 50. Generally, each portion of the memory film located within a memory opening 49 comprises a respective vertical stack of memory elements. A memory cavity 49' is formed in the volume of each memory opening 49 that is not filled with the memory film 50.

Figures 6C, 6D:
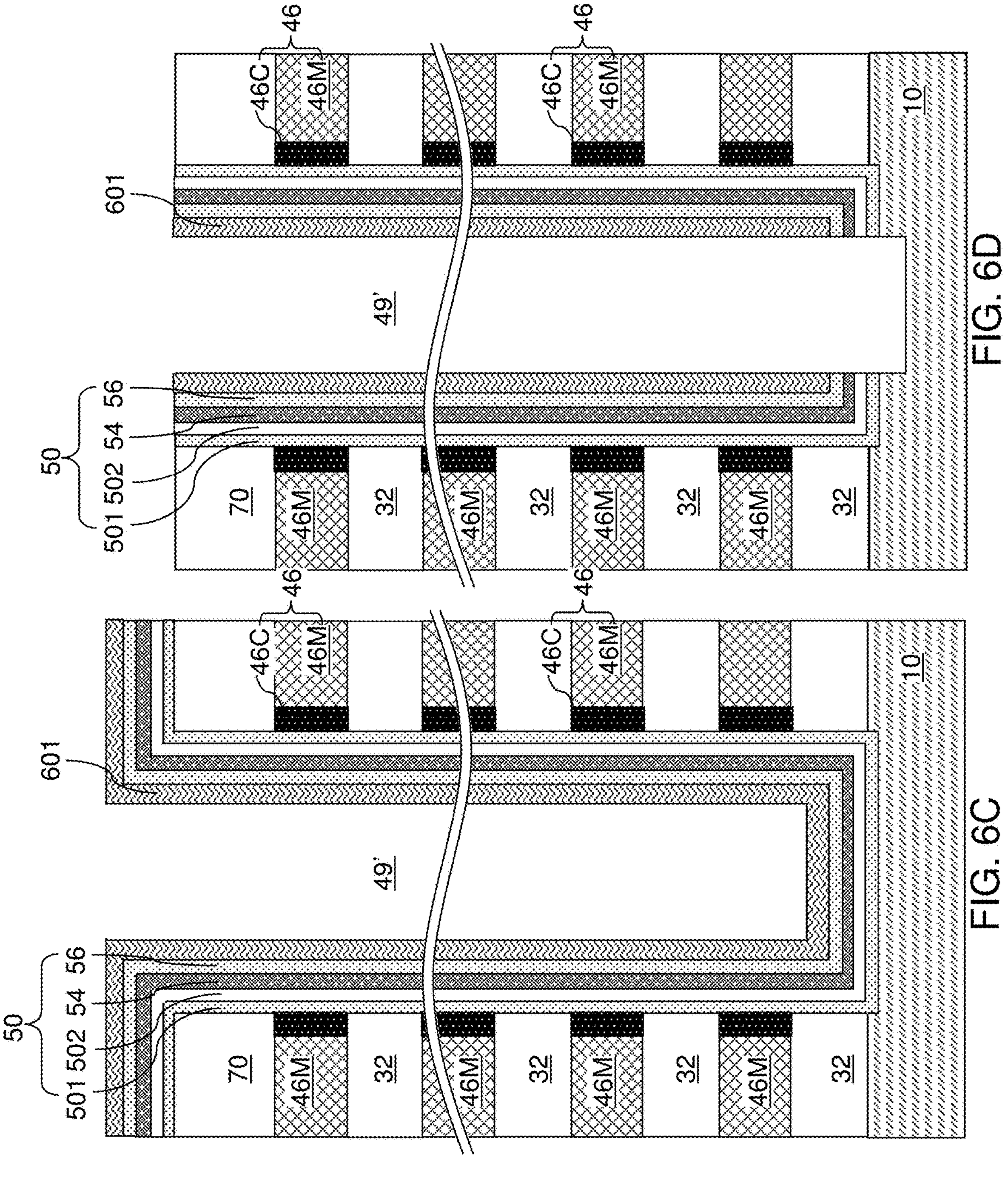

Referring to FIG. 6C, an optional sacrificial cover material layer 601 may be conformally deposited over the memory film 50. The optional sacrificial cover material layer 601 includes a sacrificial material that can be subsequently removed selective to the material of the dielectric material liner 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 6D, the optional sacrificial cover material layer 601, the dielectric material liner 56, the memory material layer 54, and the at least one blocking dielectric layer (501, 502) overlying the insulating cap layer 70 are sequentially anisotropically etched employing at least one anisotropic etch process. The portions of the sacrificial cover material layer 601, the dielectric material liner 56, the memory material layer 54, and the at least one blocking dielectric layer (501, 502) located above the top surface of the insulating cap layer 70 can be removed by the at least one anisotropic etch process. Further, the horizontal portions of the sacrificial cover material layer 601, the dielectric material liner 56, the memory material layer 54, and the at least one blocking dielectric layer (501, 502) at a bottom of each memory cavity 49' can be removed to form openings in remaining portions thereof. Each of the sacrificial cover material layer 601, the dielectric material liner 56, the memory material layer 54, and the at least one blocking dielectric layer (501, 502) can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material, a ferroelectric material, a resistive memory material that can provide at least two different levels of resistivity (such as a phase change material), or any other memory material that can store information by a change in state. In one embodiment, each memory material layer 54 can include a vertical stack of charge storage regions that store electrical charges upon programming In one embodiment, the memory material layer 54 can be a memory material layer in which each portion adjacent to the molybdenum layers 46M constitutes a charge storage region.

A surface of the semiconductor material layer 10 can be physically exposed underneath the opening through the sacrificial cover material layer 601, the dielectric material liner 56, the memory material layer 54, and the at least one blocking dielectric layer (501, 502). Optionally, the physically exposed semiconductor surface at the bottom of each memory cavity 49' can be vertically recessed so that the recessed semiconductor surface underneath the memory cavity 49' is vertically offset from the topmost surface of the semiconductor material layer 10 by a recess distance. A dielectric material liner 56 is located over the memory material layer 54. A set of at least one blocking dielectric layer (501, 502), a memory material layer 54, and a dielectric material liner 56 in a memory opening 49 constitutes a memory film 50, which includes a plurality of charge storage regions (as embodied as the memory material layer 54) that are insulated from surrounding materials by the at least one blocking dielectric layer (501, 502) and the dielectric material liner 56. In one embodiment, the sacrificial cover material layer 601, the dielectric material liner 56, the memory material layer 54, and the at least one blocking dielectric layer (501, 502) can have vertically coincident sidewalls. The sacrificial cover material layer 601 can be subsequently removed selective to the material of the dielectric material liner 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained in the final device if it comprises a semiconductor material.

Figures 6E, 6F:
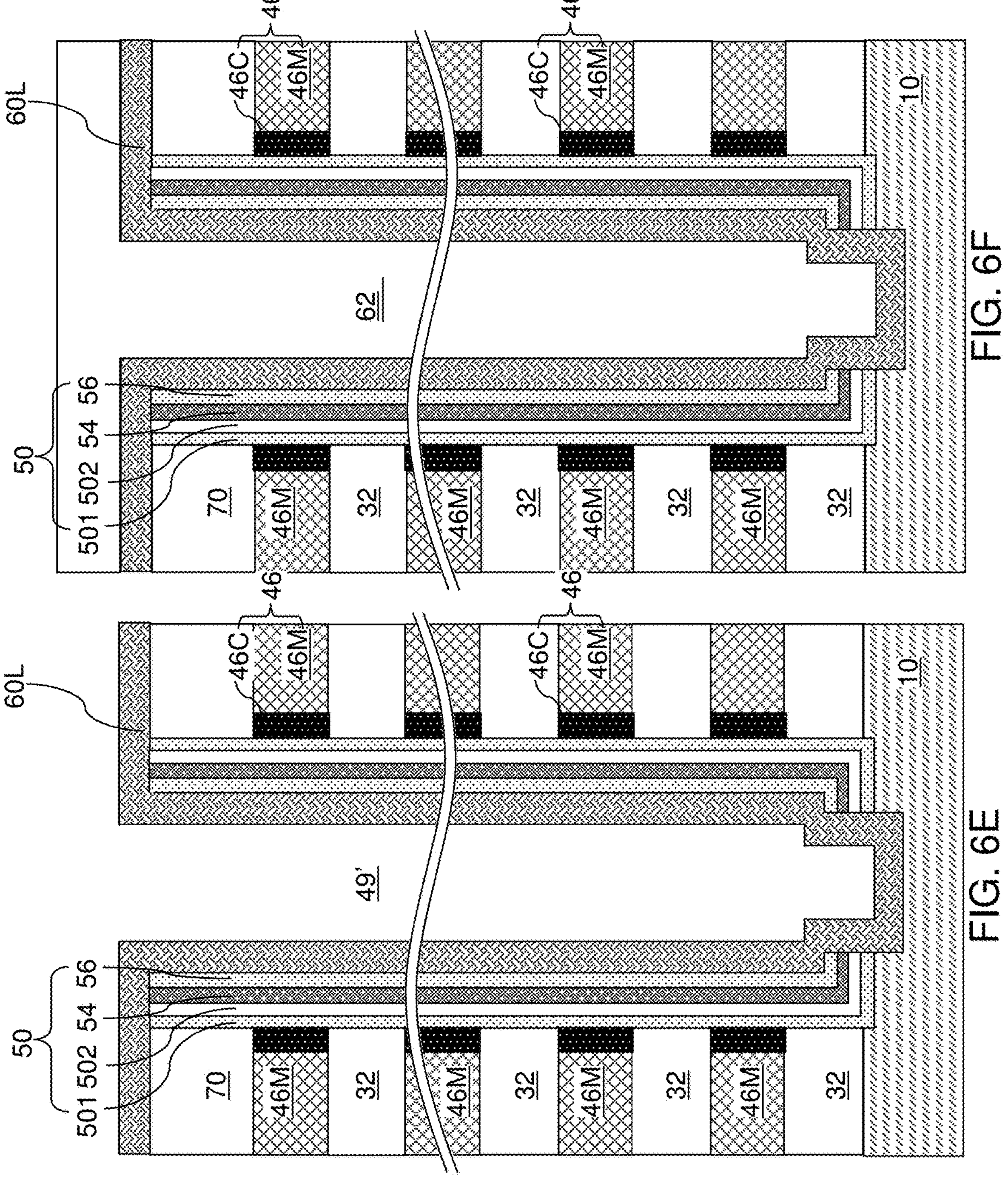

Referring to FIG. 6E, a semiconductor channel layer 60L can be deposited directly on the semiconductor surface of the semiconductor material layer 10, and directly on the dielectric material liner 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 6F, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figures 6G, 6H:
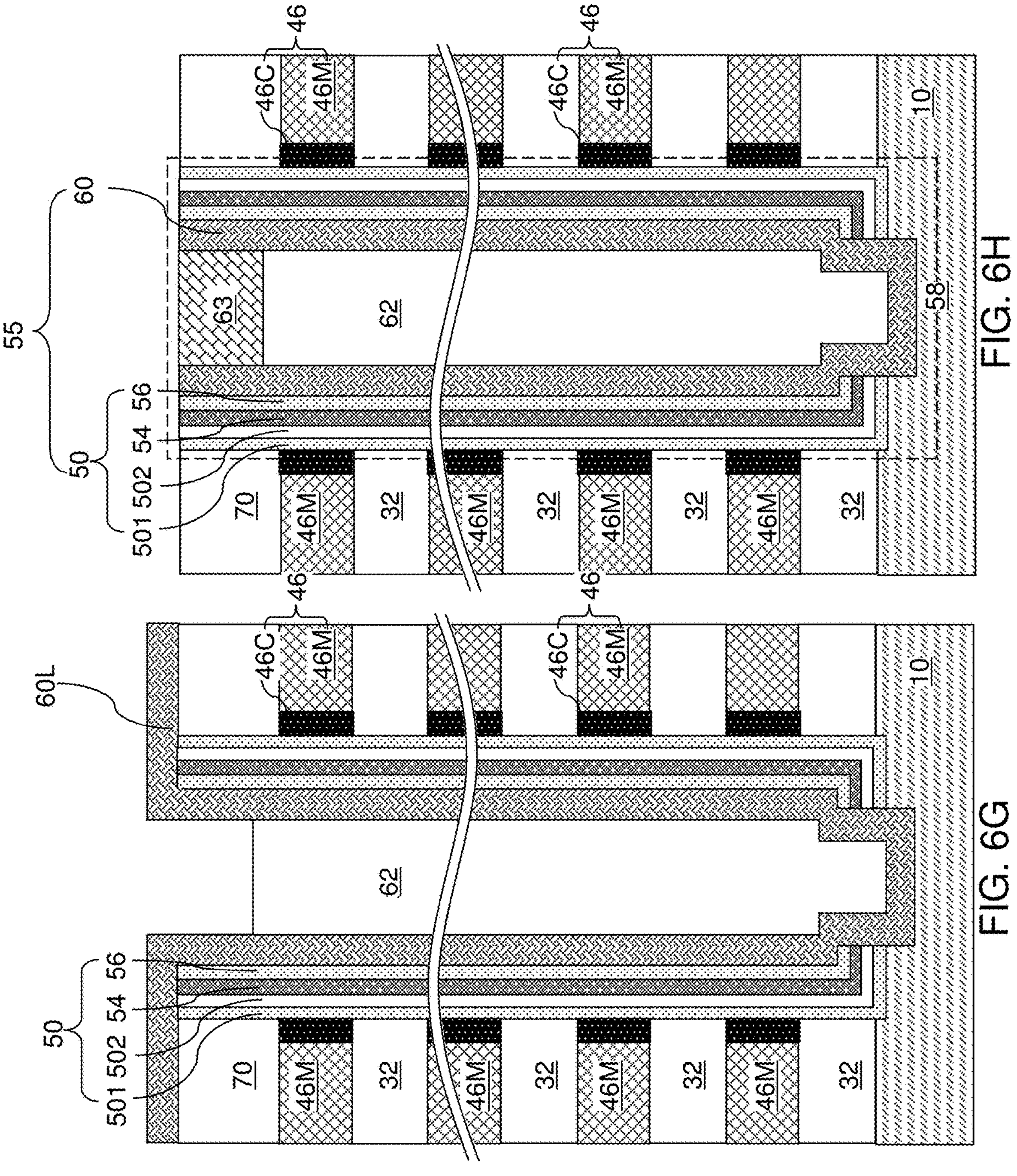

Referring to FIG. 6G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIG. 6H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60. The vertical semiconductor channel 60 is formed directly on the dielectric material liner 56.

A dielectric material liner 56 is surrounded by a memory material layer 54, and laterally surrounds a portion of the vertical semiconductor channel 60. Each adjoining set of at least one blocking dielectric layer (501, 502), a memory material layer 54, and a dielectric material liner 56 collectively constitute a memory film 50, which can store electrical charges or electrical polarization with a macroscopic retention time. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a dielectric material liner, a plurality of memory elements as embodied as portions of the memory material layer 54, and an optional at least one blocking dielectric layer (501, 502). An entire set of material portions that fills a memory opening 49 is herein referred to as a memory opening fill structure 58. An entire set of material portions that fills a support opening 19 constitutes a support pillar structure.

Generally, a memory opening fill structure 58 can be formed in each memory opening 49. The memory opening fill structure 58 comprises an optional at least one blocking dielectric layer (501, 502), a memory material layer 54, an optional dielectric material liner 56, and a vertical semiconductor channel 60. A dielectric material liner 56 may laterally surround the vertical semiconductor channel 60. The memory material layer 54 can laterally surround the dielectric material liner 56.

FIGS. 7A-7D are sequential vertical cross-sectional views of a memory opening 49 during formation of conductive capping material portions 46C and a memory opening fill structure 58 having a second configuration according to an embodiment of the present disclosure. The second configuration of the memory opening fill structure 58 may be formed in each memory opening 49 in lieu of the first configuration of the memory opening fill structure 58 illustrated in FIG. 6H.

Figures 7A, 7B:
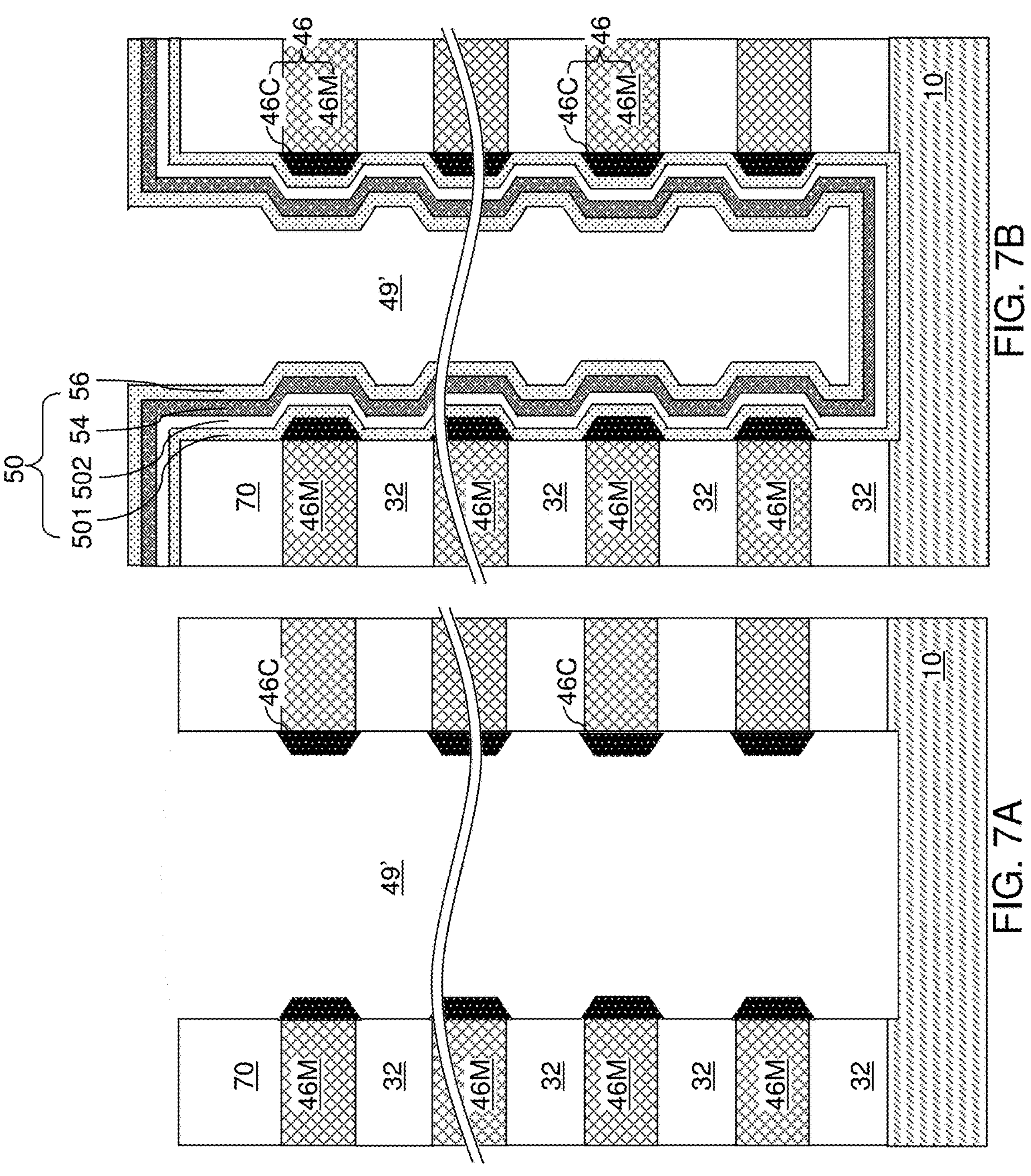
FIGS. 7A-7D are sequential vertical cross-sectional views of a memory opening during formation of conductive capping material portions and a memory opening fill structure having a second configuration according to an embodiment of the present disclosure.

Referring to FIG. 7A, a second configuration of the first exemplary structure can be derived from the first configuration of the exemplary structure illustrated in FIG. 6A by omitting the processing steps of FIGS. 5A and 5B which form the lateral recesses 41R, or by forming the conductive capping material portions 46C in the lateral recesses 41R such that an inner sidewall of each conductive capping material portion 46C around a memory opening 49 protrudes inward from a cylindrical vertical plane including sidewalls of the insulating layers 32 around the memory opening 49. The outer sidewall of each conductive capping material portion 46C may be located within the cylindrical vertical plane including the sidewalls of the insulating layers 32 around the memory opening 49 in case the lateral recesses 41R are omitted. Alternatively, the outer sidewall of each conductive capping material portion 46C may be recessed outward from the cylindrical vertical plane including the sidewalls of the insulating layers 32 around the memory opening 49 in case the lateral recesses 41R are present.

Referring to FIG. 7B, the processing steps of FIG. 6B can be performed to form at least one blocking dielectric layer (501, 502), a memory material layer 54, and a dielectric material liner 56.

Figures 7C, 7D:
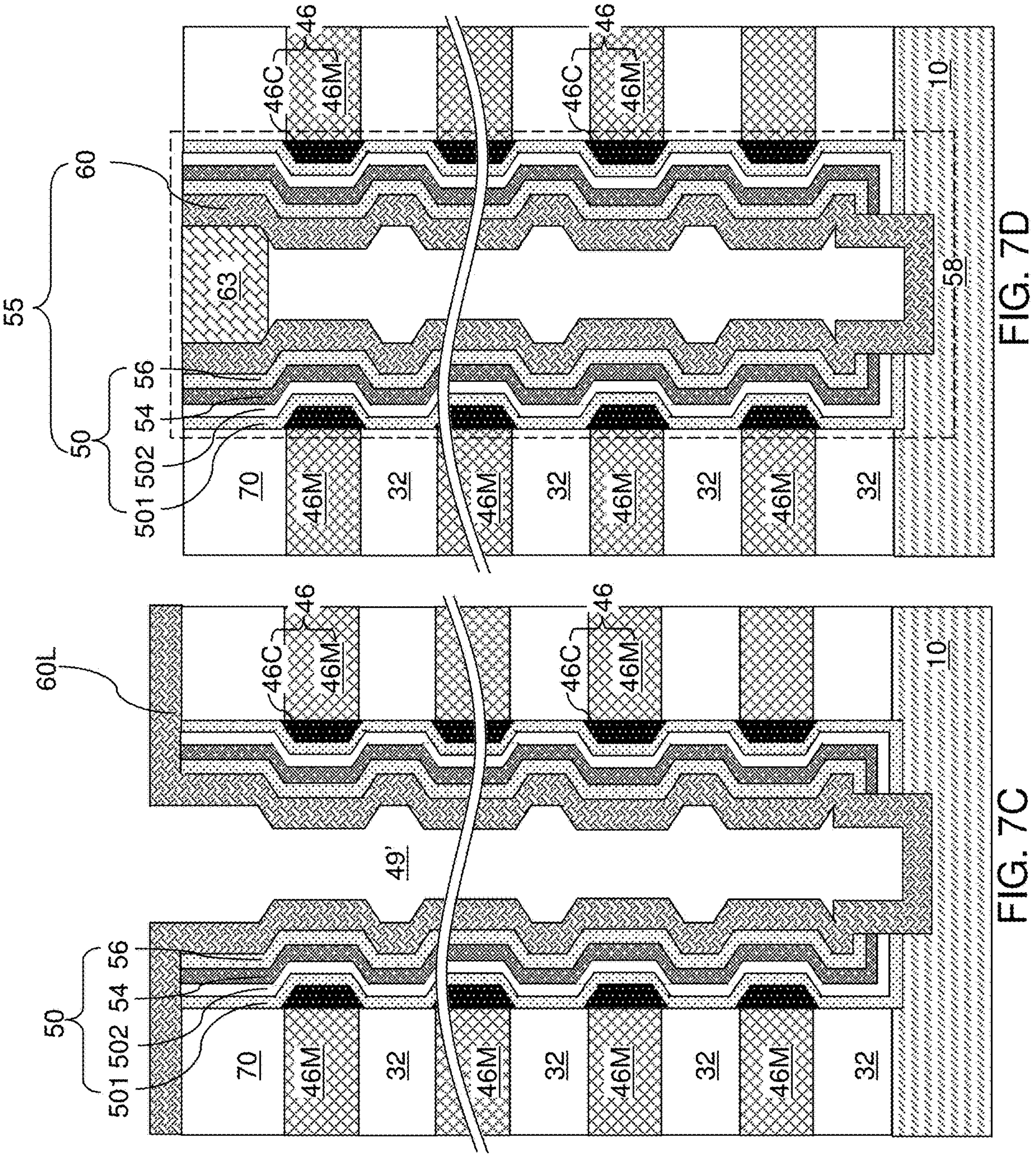

Referring to FIG. 7C, the processing steps of FIGS. 6C, 6D, and 6E can be performed to form a respective opening in a memory film 50 at a bottom region of each memory opening 49 and at a bottom region of each support opening 49, and to form a semiconductor channel layer 60L.

Referring to FIG. 7D, the processing steps of FIGS. 6F, 6G, and 6H can be performed to form a dielectric core 60 and a drain region 63 within each memory opening 49 and within each support opening 49.

Figure 8:
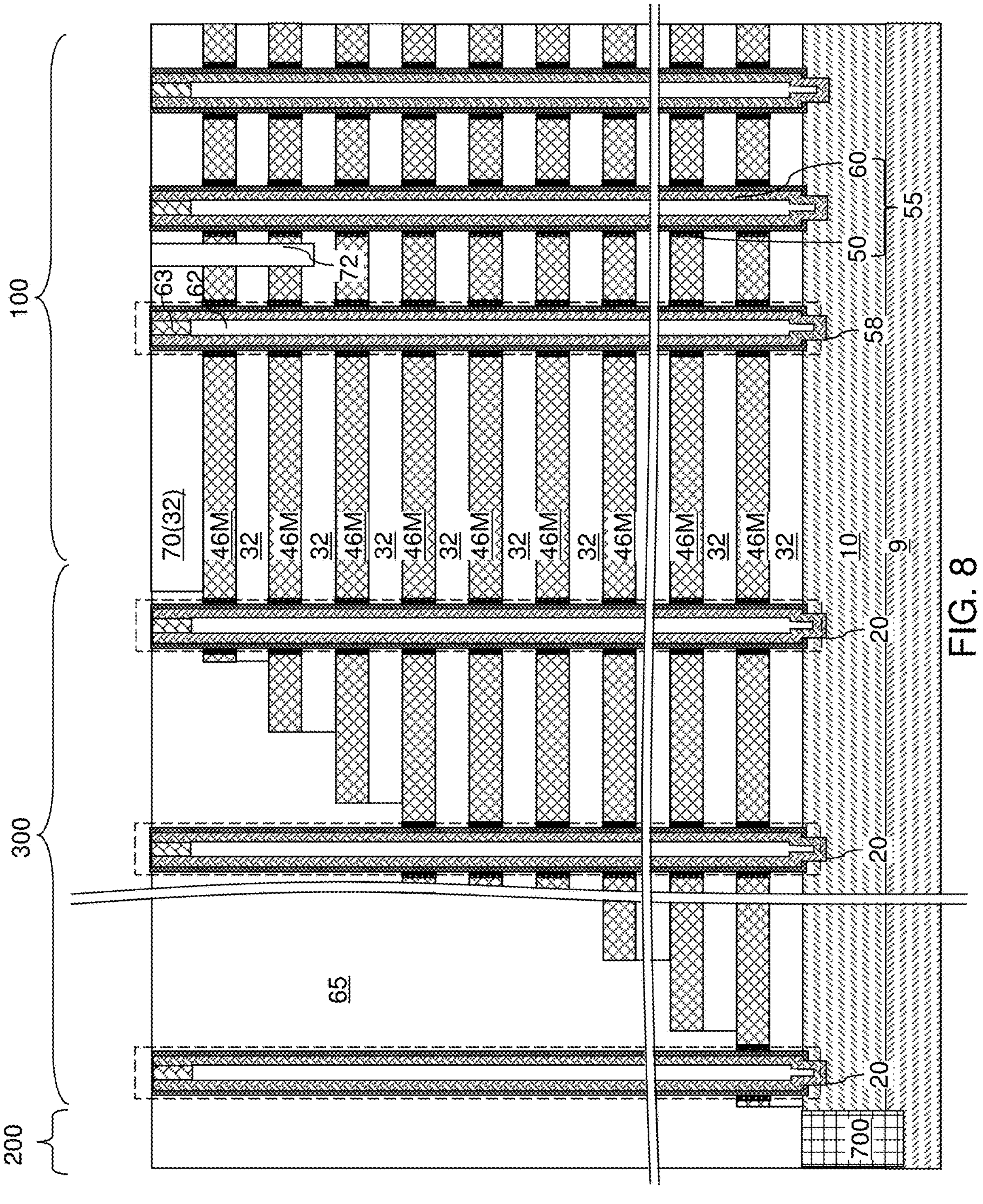
FIG. 8 is a schematic vertical cross-sectional view of the first exemplary structure after formation of memory stack structures and support pillar structures according to an embodiment of the present disclosure.

Referring to FIG. 8, the first exemplary structure is illustrated after formation of memory opening fill structures 58 within each memory opening 49 and support pillar structures 20 within each support opening 20. In one embodiment, each of the memory opening fill structures 58 comprises a respective memory film 50 that vertically extends from a topmost layer within the alternating stack (32, 46) to a bottommost layer within the alternating stack (32, 46). Further, each of the memory opening fill structures 58 comprises a respective vertical semiconductor channel 60 that vertically extends from the topmost layer within the alternating stack (32, 46) to the bottommost layer within the alternating stack (32, 46). Each memory opening fill structure 58 may comprise a respective vertical stack of memory elements. In one embodiment, the respective vertical stack of memory elements comprises portions of the respective memory film 50 located at levels of the electrically conductive layers 46.

In one embodiment, the respective memory film 50 comprises a respective set of at least one blocking dielectric layer (501, 502) that laterally surrounds the respective vertical stack of memory elements. The respective set of at least one blocking dielectric layer (501, 502) comprises an outer sidewall that contacts each of the insulating layers 32 within the alternating stack (32, 46), and contacts each of the electrically conductive layers 46 within the alternating stack (32, 46). In one embodiment, the respective set of at least one blocking dielectric layer (501, 502) comprises a layer stack that comprises a dielectric metal oxide blocking dielectric layer (501, 502) in contact with each of the insulating layers 32 within the alternating stack (32, 46) and within each of the electrically conductive layers 46 within the alternating stack (32, 46), and a silicon oxide blocking dielectric layer 502 in contact with the respective vertical stack of memory elements.

Figure 9A:
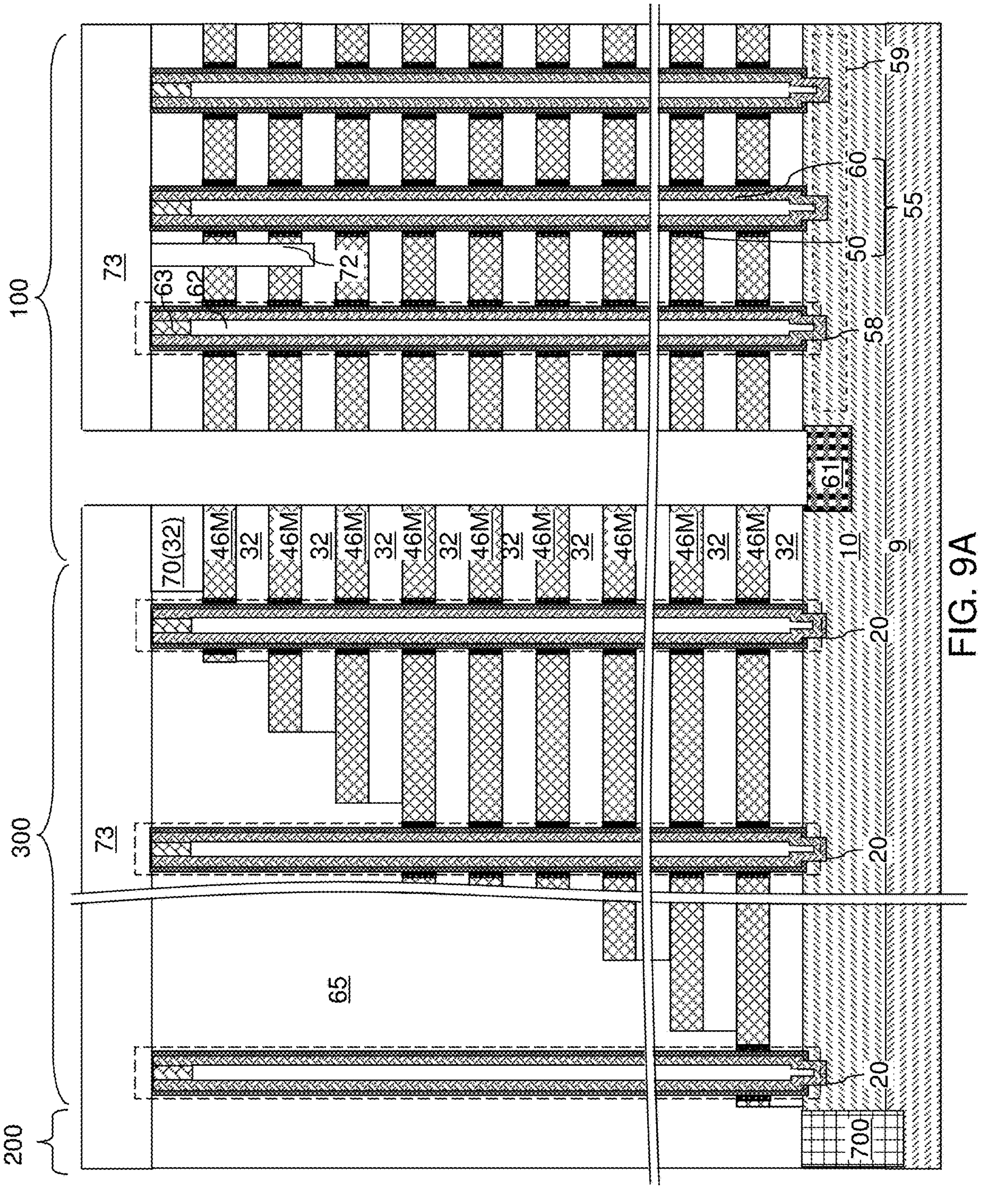
FIG. 9A is a schematic vertical cross-sectional view of the first exemplary structure after formation of backside trenches according to an embodiment of the present disclosure.
Figure 9B:
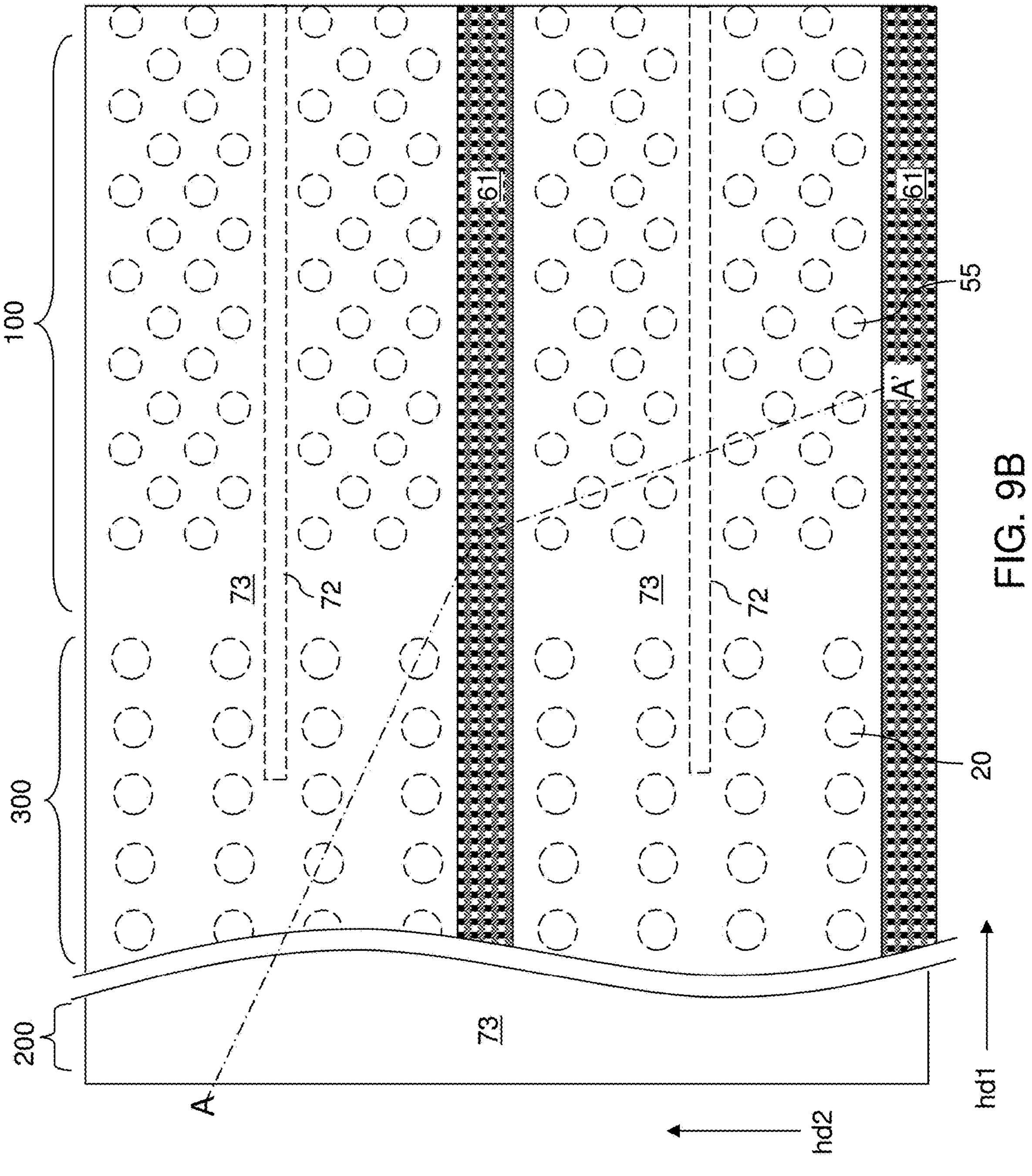
FIG. 9B is a partial see-through top-down view of the first exemplary structure of FIG. 9A. The vertical plane A-A' is the plane of the schematic vertical cross-sectional view of FIG. 9A.

Referring to FIGS. 9A and 9B, a contact-level dielectric layer 73 can be formed over the alternating stack (32, 46) of insulating layer 32 and electrically conductive layers 46, and over the memory opening fill structures 58 and the support pillar structures 20. The contact-level dielectric layer 73 includes a dielectric material that is different from the dielectric material of the electrically conductive layers 46. For example, the contact-level dielectric layer 73 can include silicon oxide. The contact-level dielectric layer 73 can have a thickness in a range from 50 nm to 500 nm, although lesser and greater thicknesses can also be employed. A photoresist layer (not shown) can be applied over the contact-level dielectric layer 73, and is lithographically patterned to form openings in areas between clusters of memory opening fill structures 58. The pattern in the photoresist layer can be transferred through the contact-level dielectric layer 73, the alternating stack (32, 46) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory opening fill structures 58 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory opening fill structures 58 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

A source region 61 can be formed at a surface portion of the semiconductor material layer 10 under each backside trench 79 by implantation of electrical dopants into physically exposed surface portions of the semiconductor material layer 10. An upper portion of the semiconductor material layer 10 that extends between the source region 61 and the vertical semiconductor channels 60 constitutes a horizontal semiconductor channel 59 for a plurality of field effect transistors. The horizontal semiconductor channel 59 is connected to multiple vertical semiconductor channels 60. The horizontal semiconductor channel 59 contacts the source region 61 and the plurality of vertical semiconductor channels 60.

Figure 10:
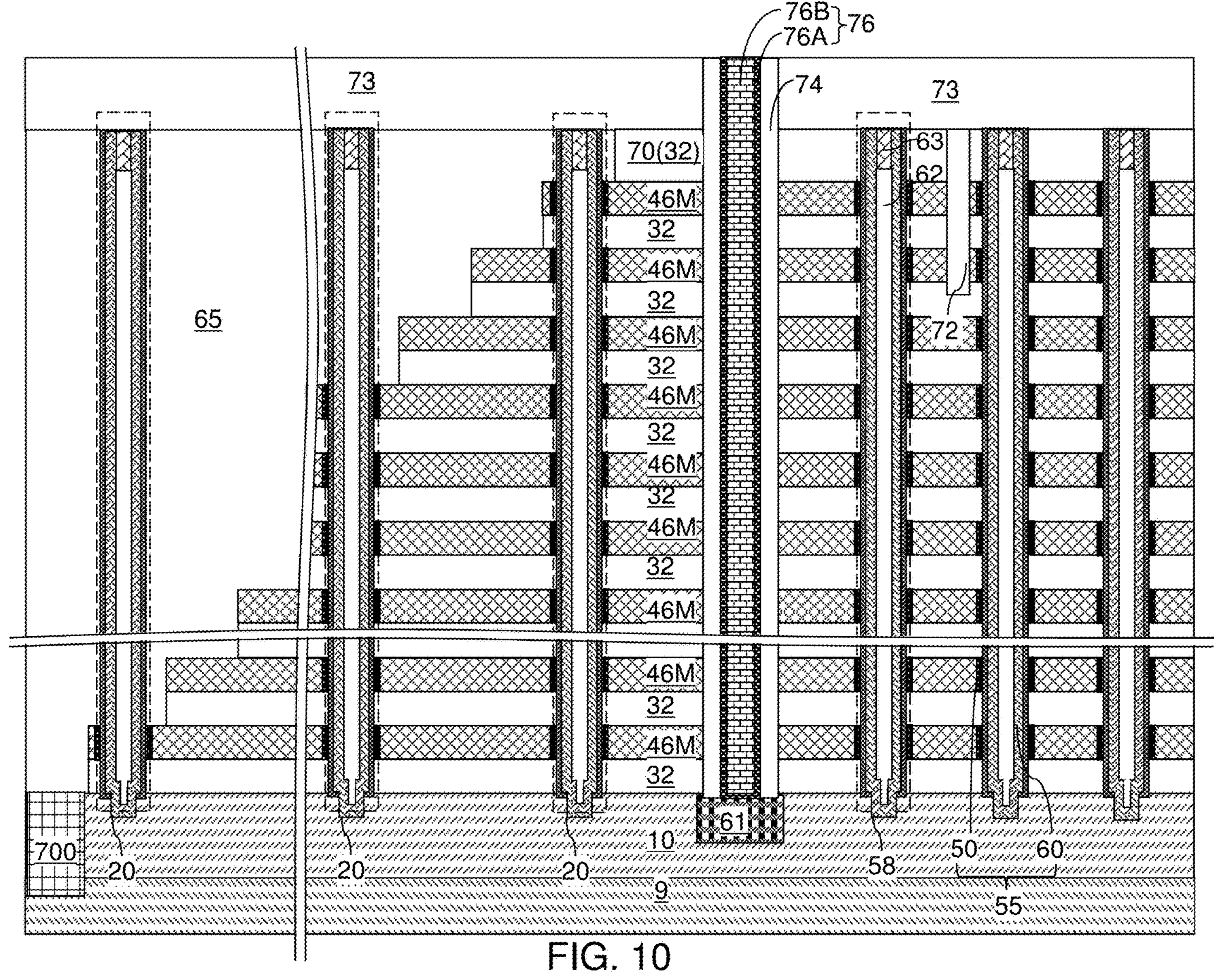
FIG. 10 is a schematic vertical cross-sectional view of the first exemplary structure after formation of an insulating spacer and a backside contact structure in each backside trench according to an embodiment of the present disclosure.

Referring to FIG. 10, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity is present within a volume surrounded by each insulating spacer 74. A top surface of the semiconductor material layer 10 can be physically exposed at the bottom of each backside trench 79.

A backside contact via structure 76 can be formed within each backside cavity 79'. Each backside contact via structure 76 can fill a respective cavity. The backside contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61.

Figure 11A:
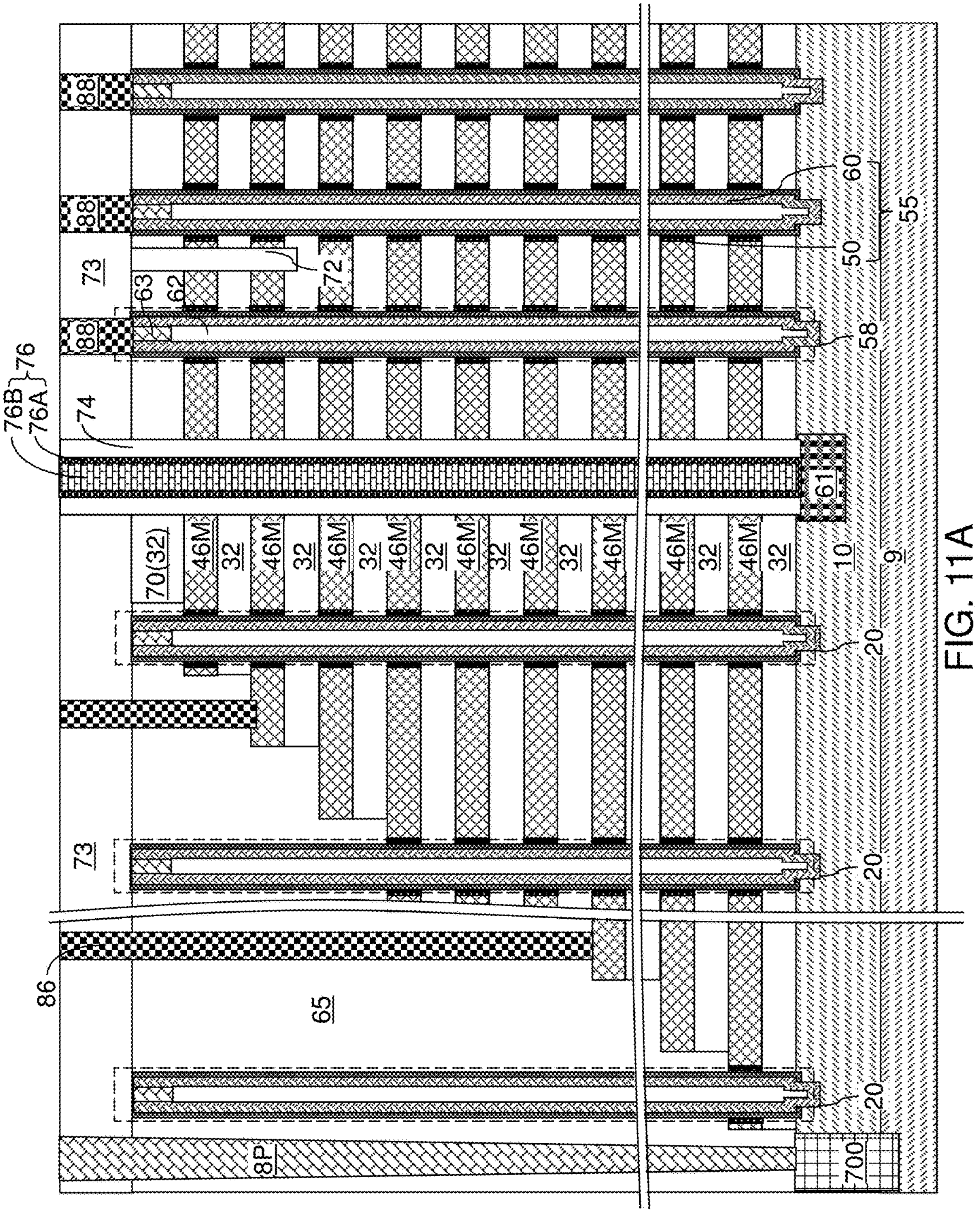
FIG. 11A is a schematic vertical cross-sectional view of the first exemplary structure after formation of additional contact via structures according to an embodiment of the present disclosure.
Figure 11B:
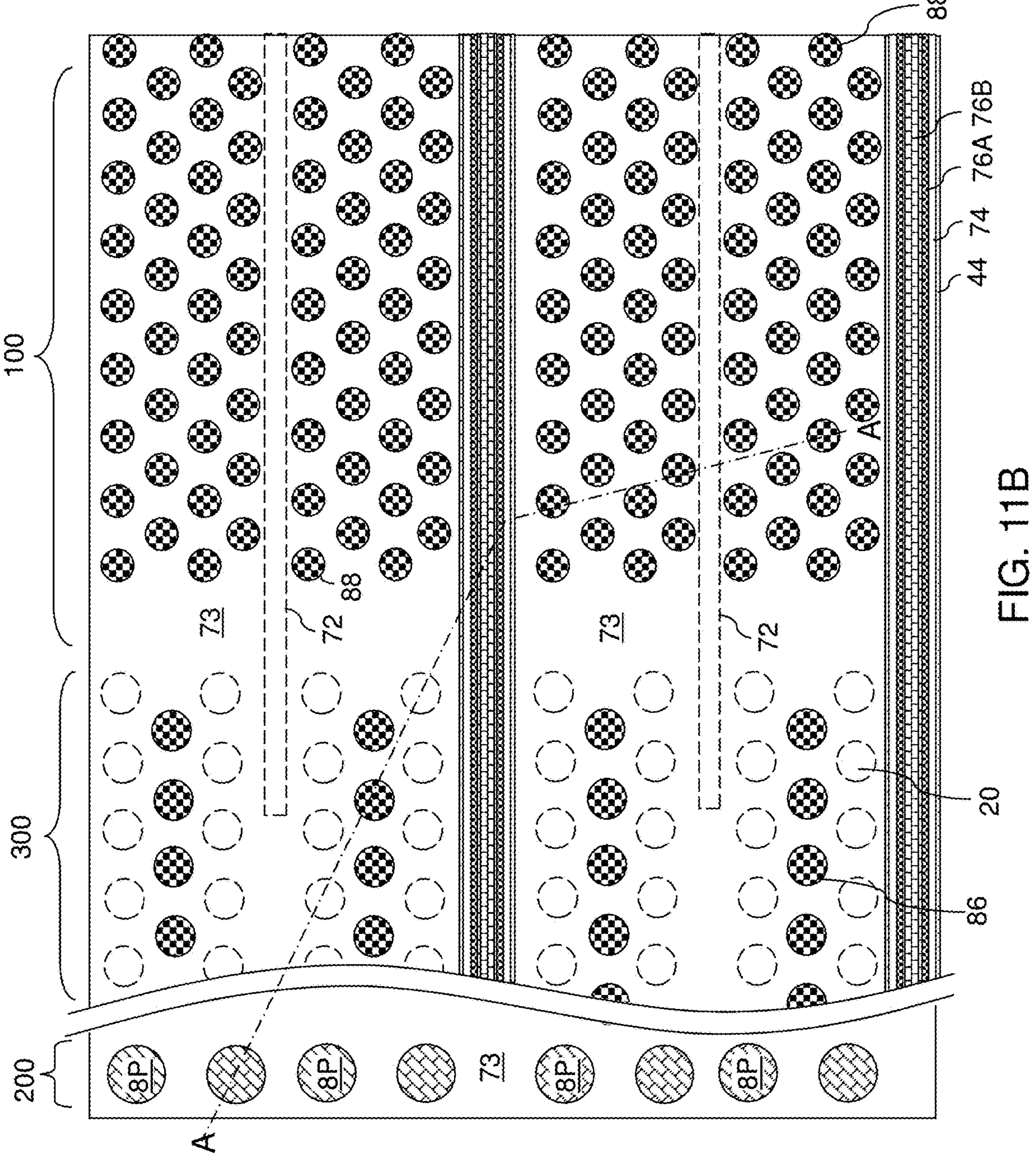
FIG. 11B is a top-down view of the first exemplary structure of FIG. 11A. The vertical plane A-A' is the plane of the schematic vertical cross-sectional view of FIG. 11A.

Referring to FIGS. 11A and 11B, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices. Bit lines (not shown) are then formed in electrical contact with the drain contact via structures 88.

Figure 12:
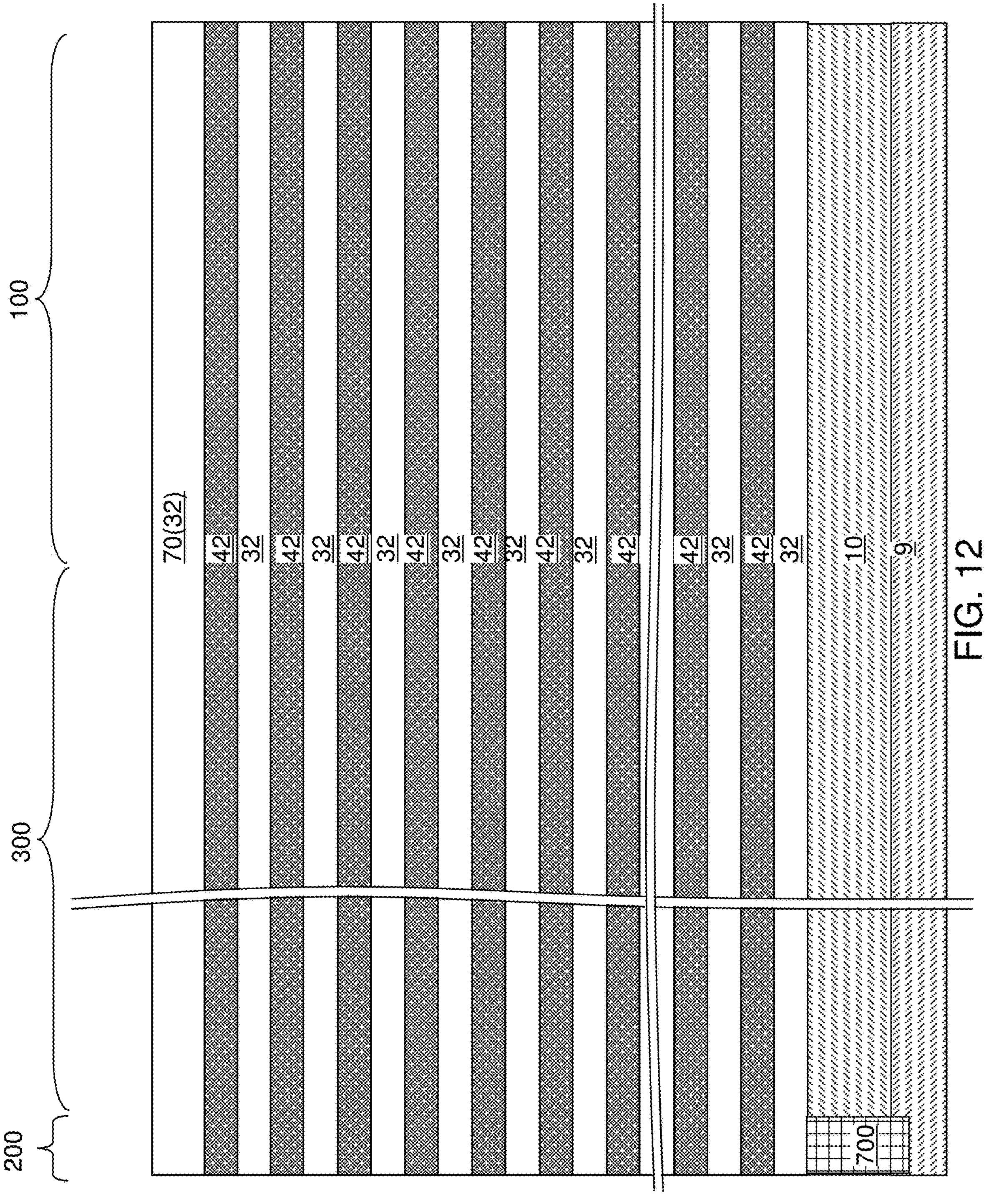
FIG. 12 is a schematic vertical cross-sectional view of the second exemplary structure after formation of an alternating stack of insulating layers and sacrificial material layers according to an embodiment of the present disclosure.

Referring to FIG. 12, a second exemplary structure according to an embodiment of the present disclosure can be derived from the first exemplary structure by forming sacrificial material layers 42 in lieu of the molybdenum layers 46M at the processing steps of FIG. 2. Thus, an alternating stack of insulating layers 32 and sacrificial material layers 42 can be formed over the substrate (9, 10).

The sacrificial material layers 42 include a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride, and can consist essentially of silicon nitride.

The second material of the sacrificial material layers 42 can be formed, for example, by CVD or ALD. The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. In one embodiment, each sacrificial material layer 42 in the alternating stack (32, 46) can have a uniform thickness that is substantially invariant within each respective sacrificial material layer 42.

Figure 13A:
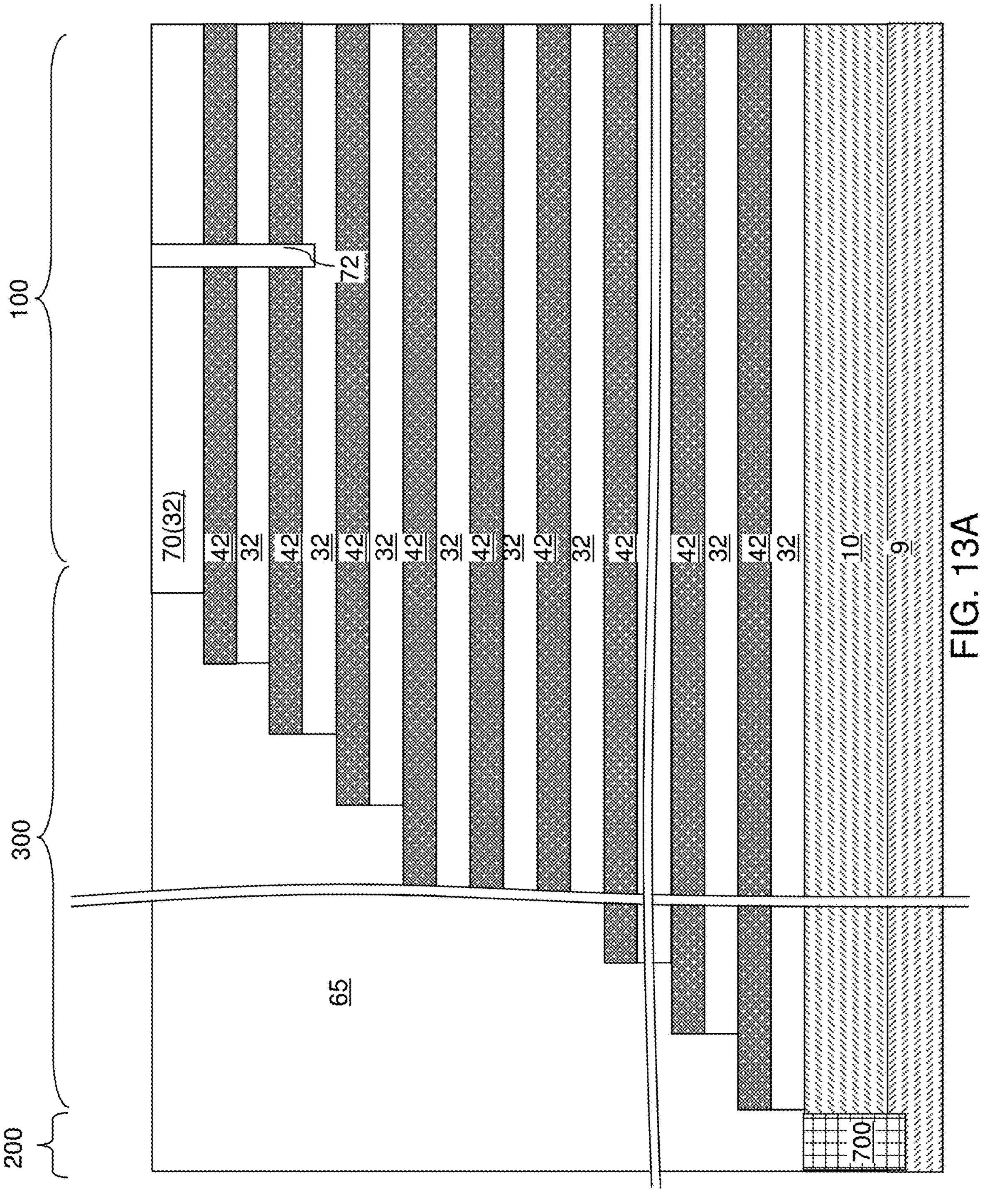
FIG. 13A is a schematic vertical cross-sectional view of the second exemplary structure after formation of stepped terraces, a retro-stepped dielectric material portion, and drain-select-level isolation structures according to an embodiment of the present disclosure.
Figure 13B:
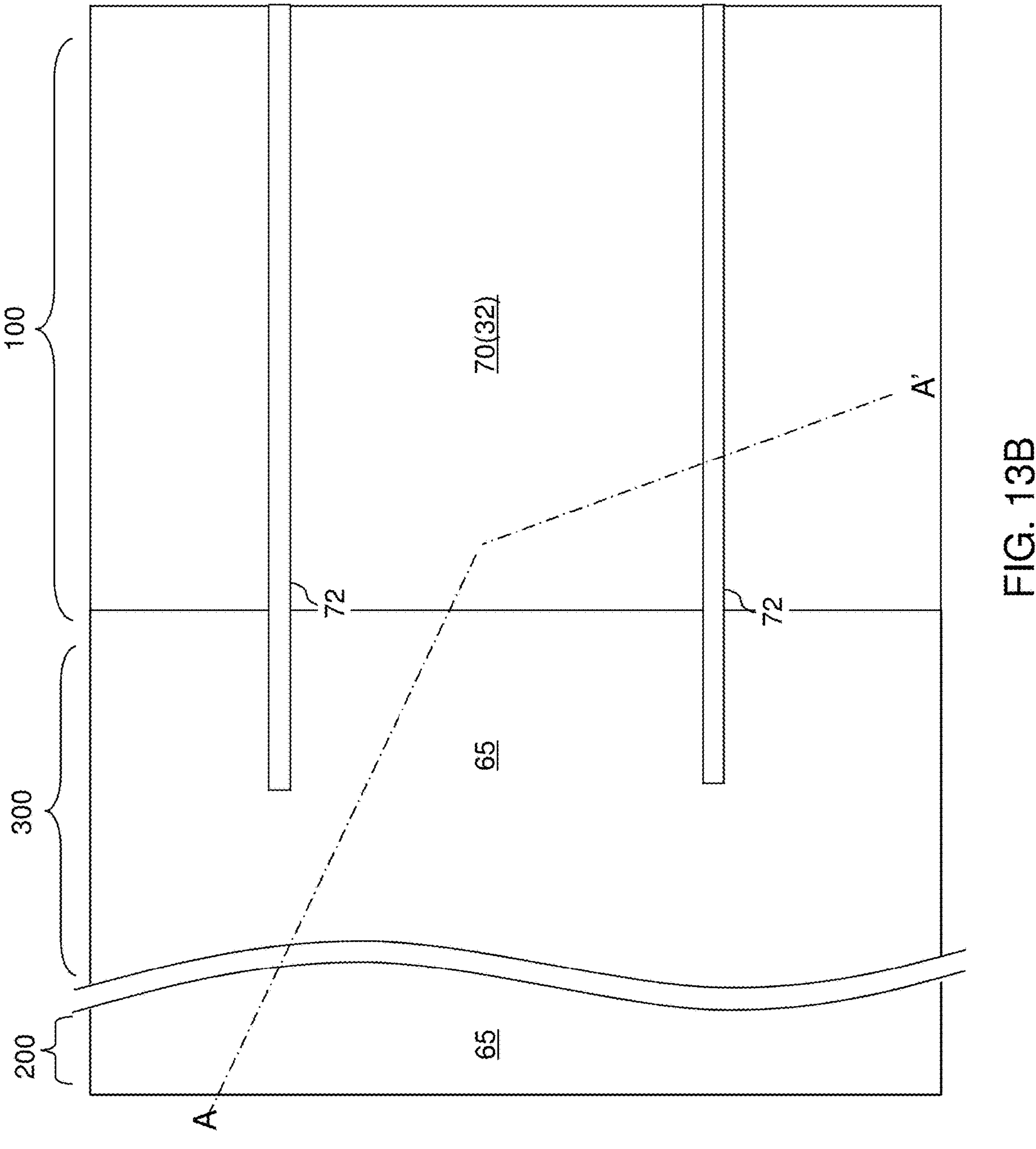
FIG. 13B is a top-down view of the second exemplary structure of FIG. 13A. The vertical plane A-A' is the plane of the cross-section for FIG. 13A.

Referring to FIGS. 13A and 13B, the processing steps of FIGS. 3A and 3B can be performed, with appropriate changes in the etch chemistry of the anisotropic etch steps that are employed to etch the sacrificial material layers 42 in lieu of the molybdenum layers 46M, to form stepped surfaces in the contact region 300, and to form a retro-stepped dielectric material portion 65. Drain-select-level isolation structures 72 may be formed as needed.

Figure 14A:
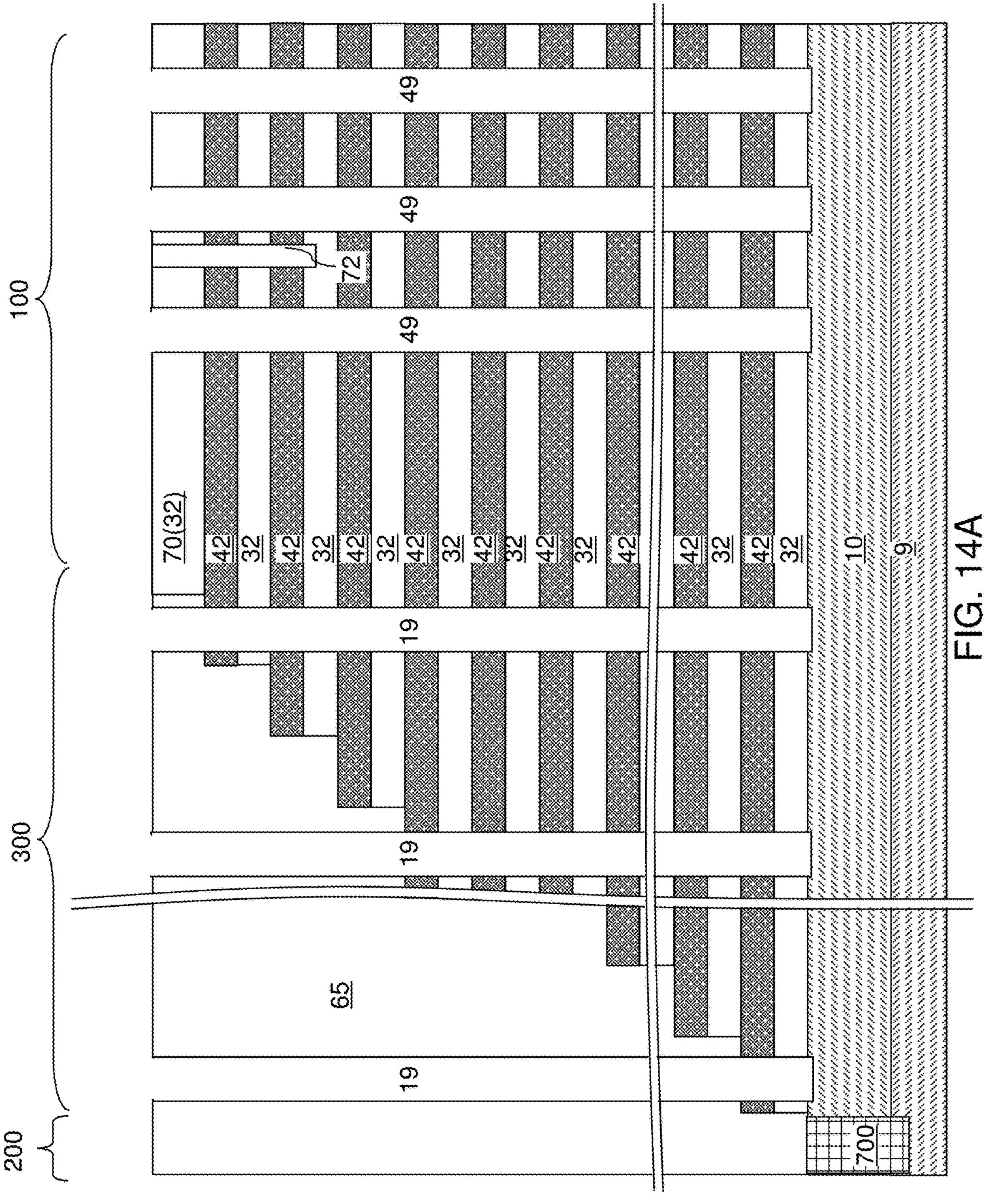
FIG. 14A is a schematic vertical cross-sectional view of the second exemplary structure after formation of memory openings and support openings according to an embodiment of the present disclosure.
Figure 14B:
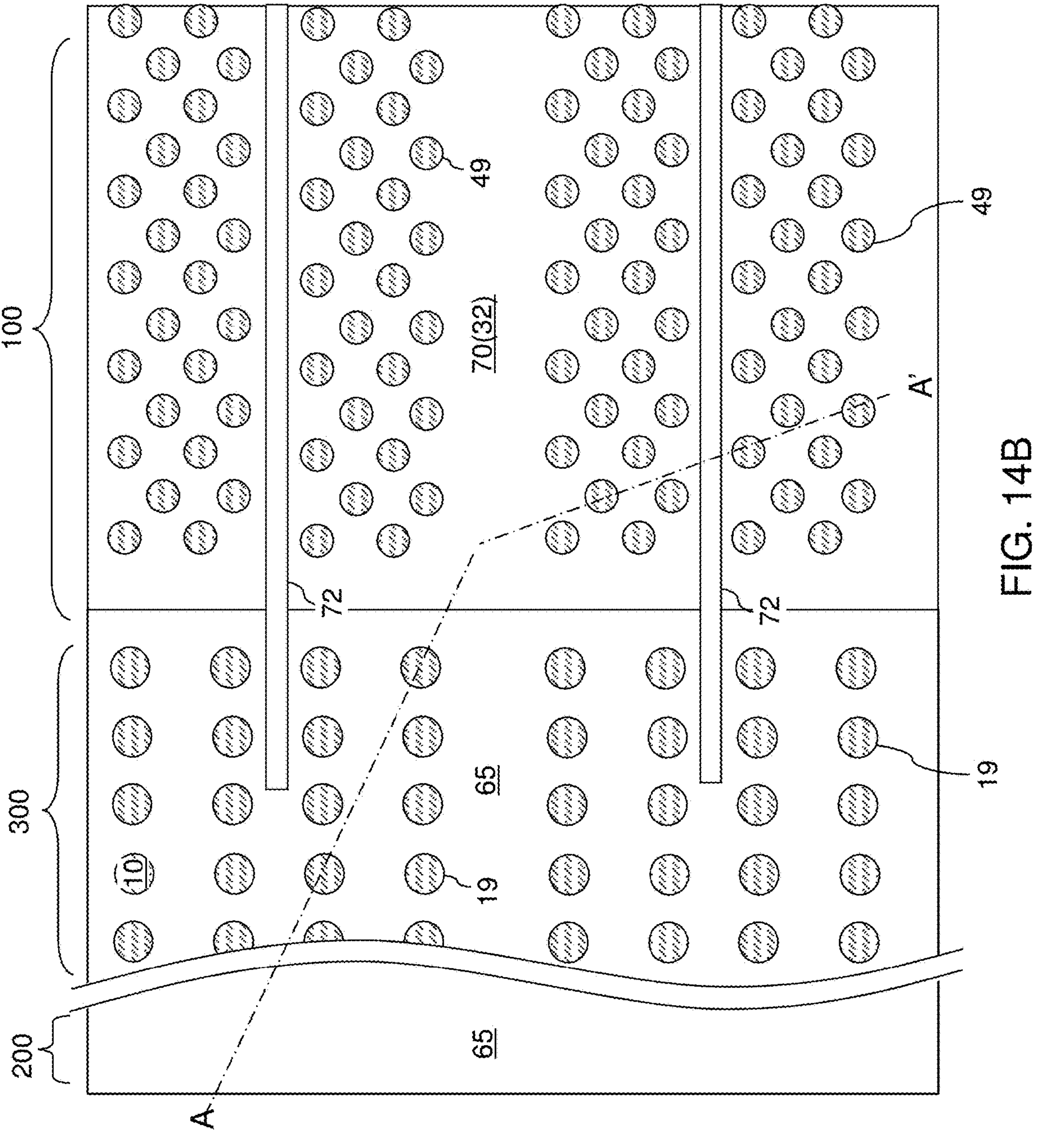
FIG. 14B is a top-down view of the second exemplary structure of FIG. 14A. The vertical plane A-A' is the plane of the cross-section for FIG. 14A.

Referring to FIGS. 14A and 14B, the processing steps of FIGS. 4A and 4B can be performed, with appropriate changes in the etch chemistry of the anisotropic etch steps that are employed to etch the sacrificial material layers 42 in lieu of the molybdenum layers 46M, to form memory openings 49 and support openings 19.

Figure 15:
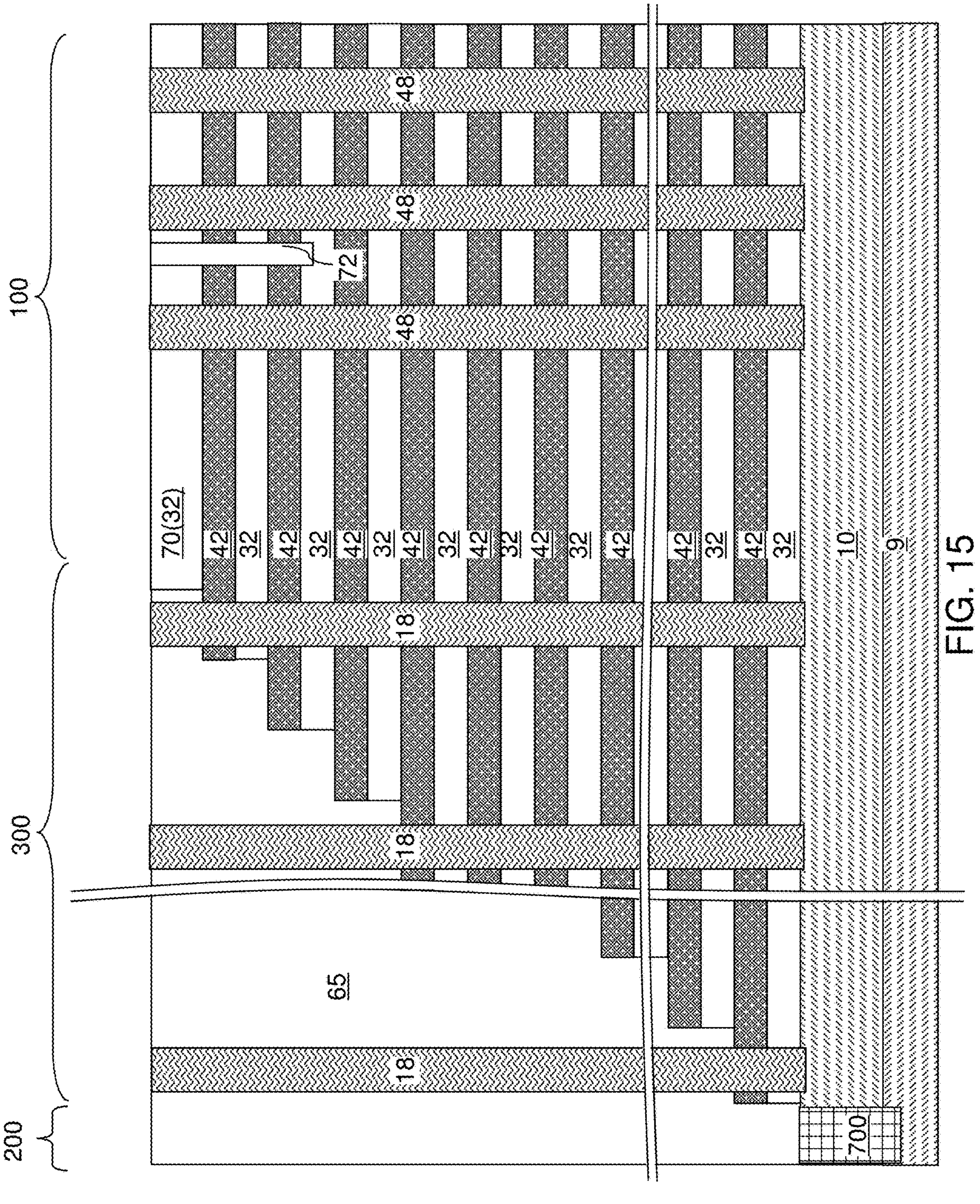
FIG. 15 is a vertical cross-sectional view of the second exemplary structure after formation of sacrificial memory opening fill structures and sacrificial support opening fill structures according to an embodiment of the present disclosure.

Referring to FIG. 15, a sacrificial fill material can be deposited in the memory openings 49 and the support openings 19. The sacrificial fill material may comprise an amorphous semiconductor material, such as a silicon-germanium alloy or amorphous silicon, a carbon-based material such as amorphous carbon or diamond-like carbon, a dielectric material such as organosilicate glass or borosilicate glass, a polymer material, or any material that can be subsequently removed selective to the materials of the semiconductor material layer 10, the insulating layers 32, and molybdenum. Excess portions of the sacrificial fill material can be subsequently removed from above the horizontal plane including the top surface of the insulating cap layer 70 and the top surface of the retro-stepped dielectric material portion 65. Remaining portions of the sacrificial fill material in the memory openings 49 comprise sacrificial memory opening fill structures 48, and remaining portions of the sacrificial fill material in the support openings 19 comprise sacrificial support opening fill structures 18. Top surfaces of the sacrificial memory opening fill structures 48 and the sacrificial support opening fill structures 18 can be coplanar with the top surface of the insulating cap layer 70 and the top surface of the retro-stepped dielectric material portion 65.

Figure 16:
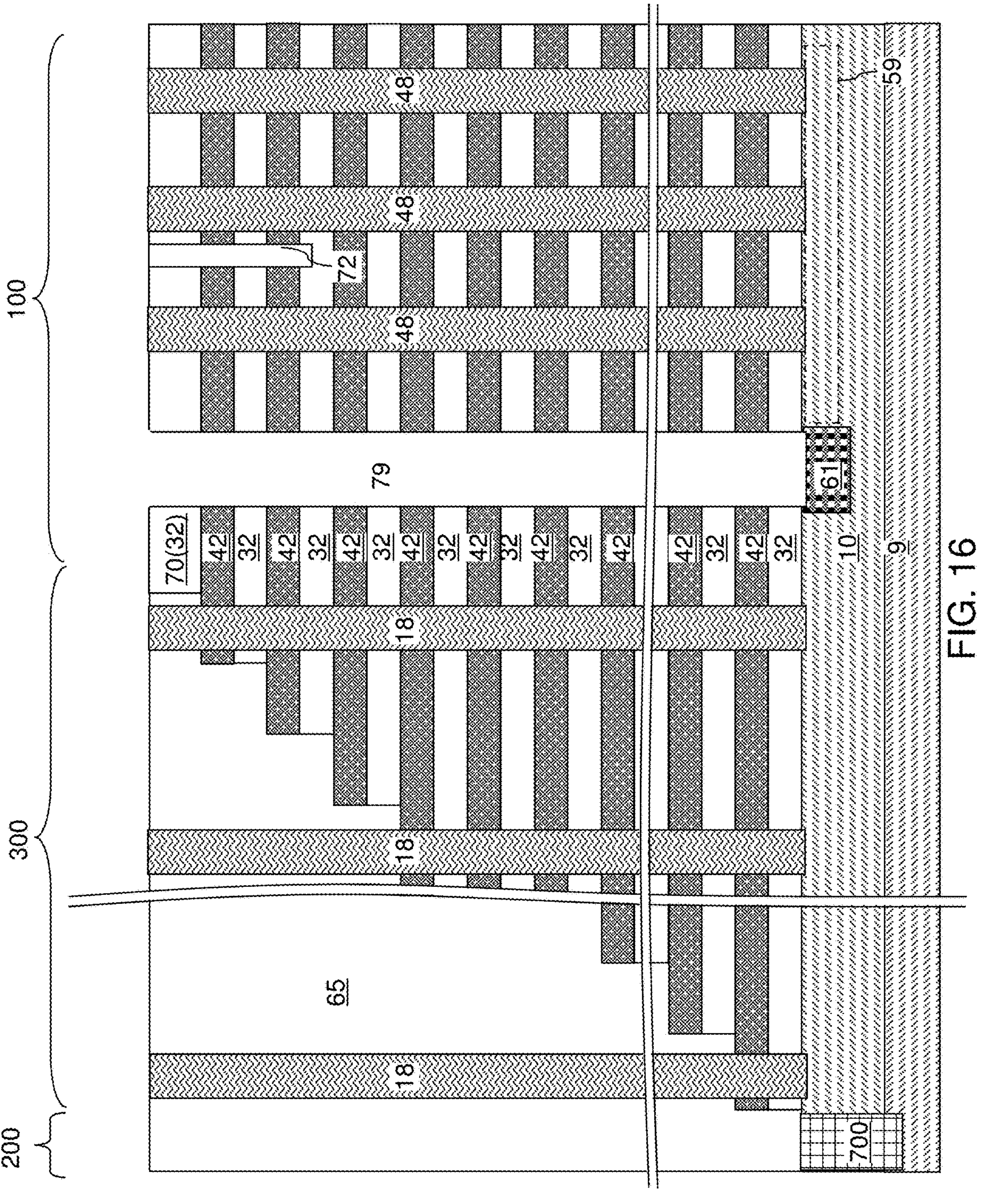
FIG. 16 is a schematic vertical cross-sectional view of the second exemplary structure after formation of backside trenches according to an embodiment of the present disclosure.

Referring to FIG. 16, a photoresist layer (not shown) can be applied over the insulating cap layer 70, and is lithographically patterned to form openings in areas between clusters of memory opening fill structures 58. The pattern in the photoresist layer can be transferred through the alternating stack (32, 46) and the retro-stepped dielectric material portion 65 employing an anisotropic etch to form backside trenches 79, which vertically extend from the top surface of the insulating cap layer 70 at least to the top surface of the substrate (9, 10), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory opening fill structures 58 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory opening fill structures 58 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

A source region 61 can be formed at a surface portion of the semiconductor material layer 10 under each backside trench 79 by implantation of electrical dopants into physically exposed surface portions of the semiconductor material layer 10.

Figure 17:
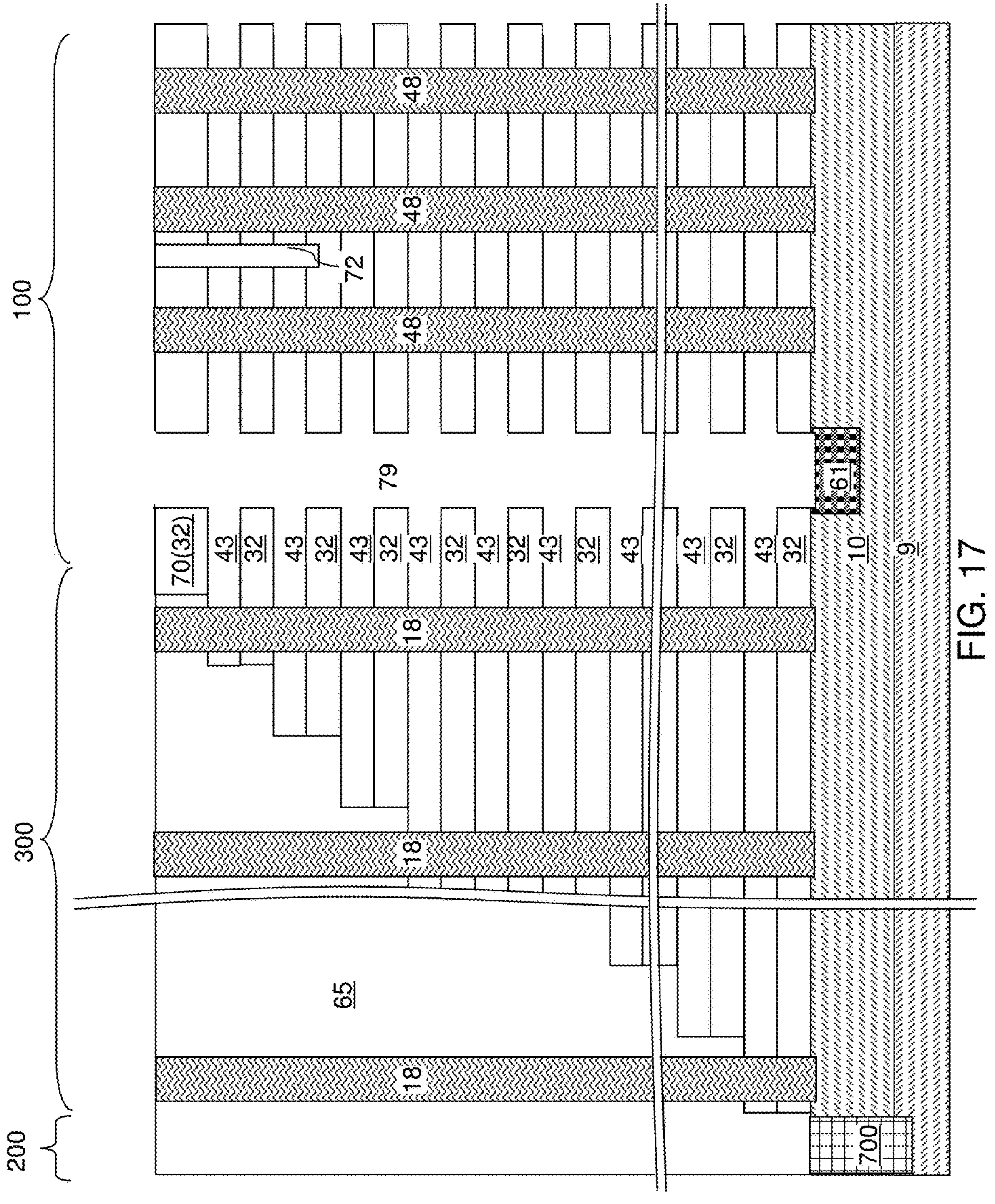
FIG. 17 is a schematic vertical cross-sectional view of the second exemplary structure after formation of backside recesses according to an embodiment of the present disclosure.

Referring to FIG. 17, an etchant that selectively etches the material of the sacrificial material layers 42 with respect to the material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the material of the insulating layers 32, the material of the retro-stepped dielectric material portion 65, the semiconductor material of the semiconductor material layer 10, and the material of the sacrificial memory opening fill structures 48 and the sacrificial support opening fill structures 18. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the sacrificial material layers 42 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The sacrificial memory opening fill structures 48, the sacrificial support opening fill structures 18, and the retro-stepped dielectric material portion 65 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of three-dimensional NAND strings having a plurality of device levels disposed above the substrate (9, 10). In this case, each backside recess 43 can define a space for receiving a respective word line of the array of three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 18:
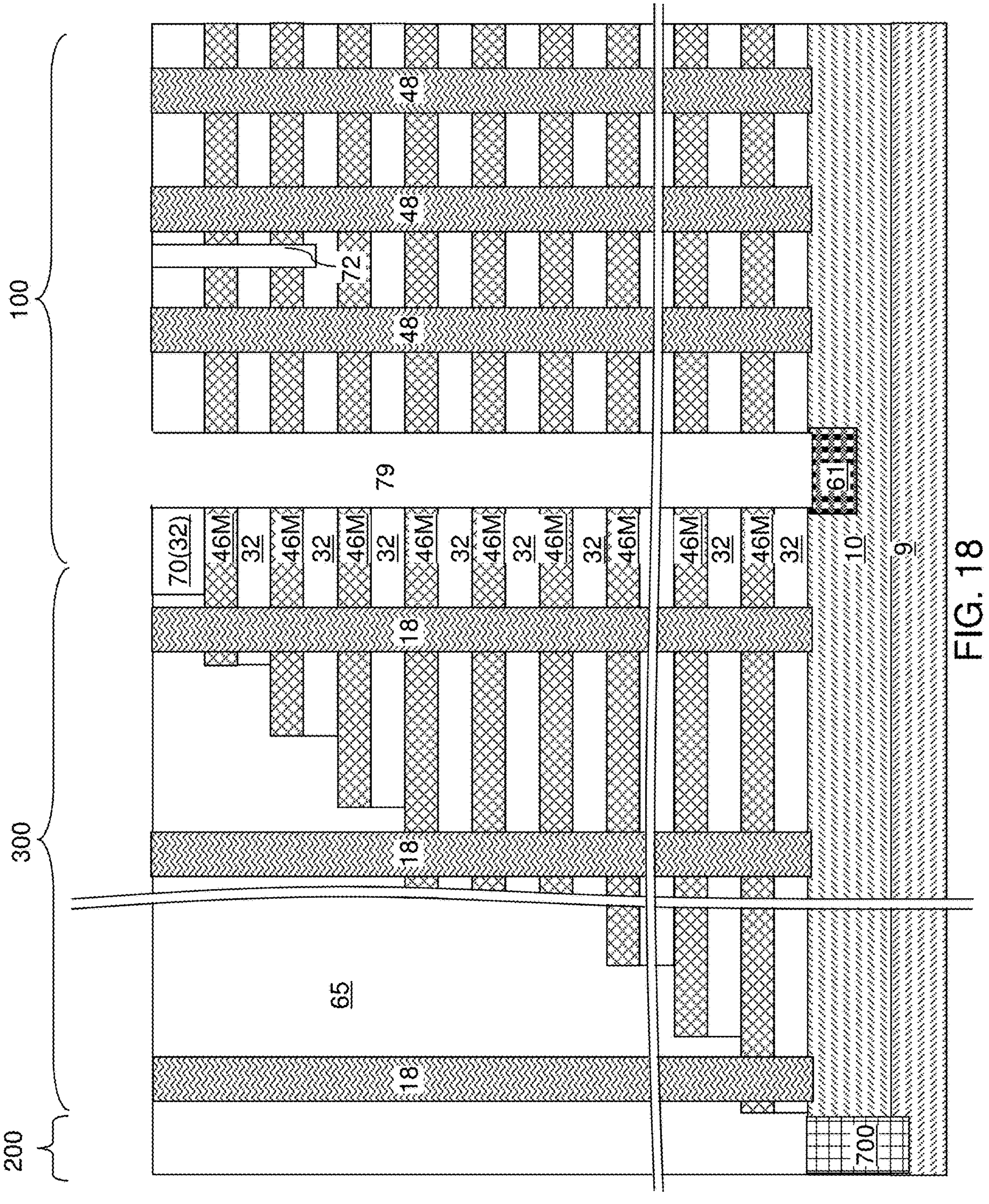
FIG. 18 is a schematic vertical cross-sectional view of the second exemplary structure after formation of molybdenum layers according to an embodiment of the present disclosure.

Referring to FIG. 18, the molybdenum layers 46M can be formed within the volumes of the backside recesses 43 by a conformal deposition process such as a chemical vapor deposition or an ALD process. In one embodiment, a chlorine-containing molybdenum precursor gas such as molybdenum pentachloride or molybdenum oxychloride can be decomposed in a CVD or ALD process to deposit molybdenum within the volumes of the backside recesses 43, in peripheral regions of the backside trenches 79, and over the top surface of the insulating cap layer 70.

An anisotropic etch process can be performed to remove portions of molybdenum that are deposited outside the volumes of the backside recesses 43. Portions of molybdenum that are deposited in the peripheral regions of the backside trenches 79 and over the top surface of the insulating cap layer 70 can be removed by the anisotropic etch process. Each remaining portion of molybdenum that remains in a respective backside recess 43 constitutes a molybdenum layer 46M. An alternating stack of the insulating layers 32 and the molybdenum layers 46M can be formed over the substrate (9, 10). In one embodiment, sidewalls of the molybdenum layers 46M that are exposed to a respective backside trench 79 may be vertically coincident with sidewalls of overlying and/or underlying insulating layers 32 that are physically exposed to the same backside trench 79.

Figure 19:
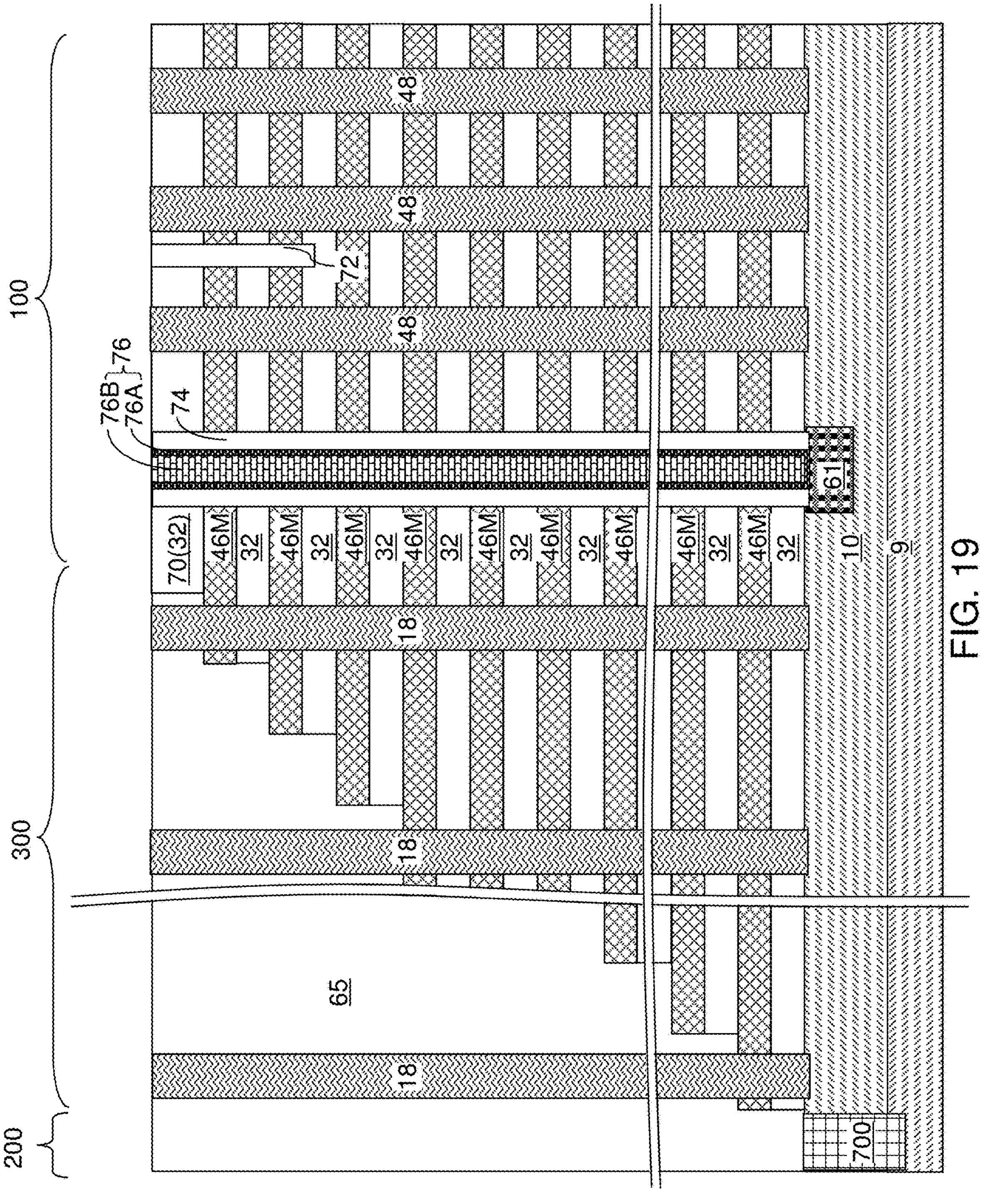
FIG. 19 is a schematic vertical cross-sectional view of the second exemplary structure after formation of an insulating spacer and a backside contact structure in each backside trench according to an embodiment of the present disclosure.

Referring to FIG. 19, the processing steps of FIG. 10 may be performed, with any needed changes in view of absence of a contact-level dielectric layer 73 in the second exemplary structure at this processing step, to form an insulating spacer 74 and a backside contact via structure 76 within each backside trench 79.

Figure 20:
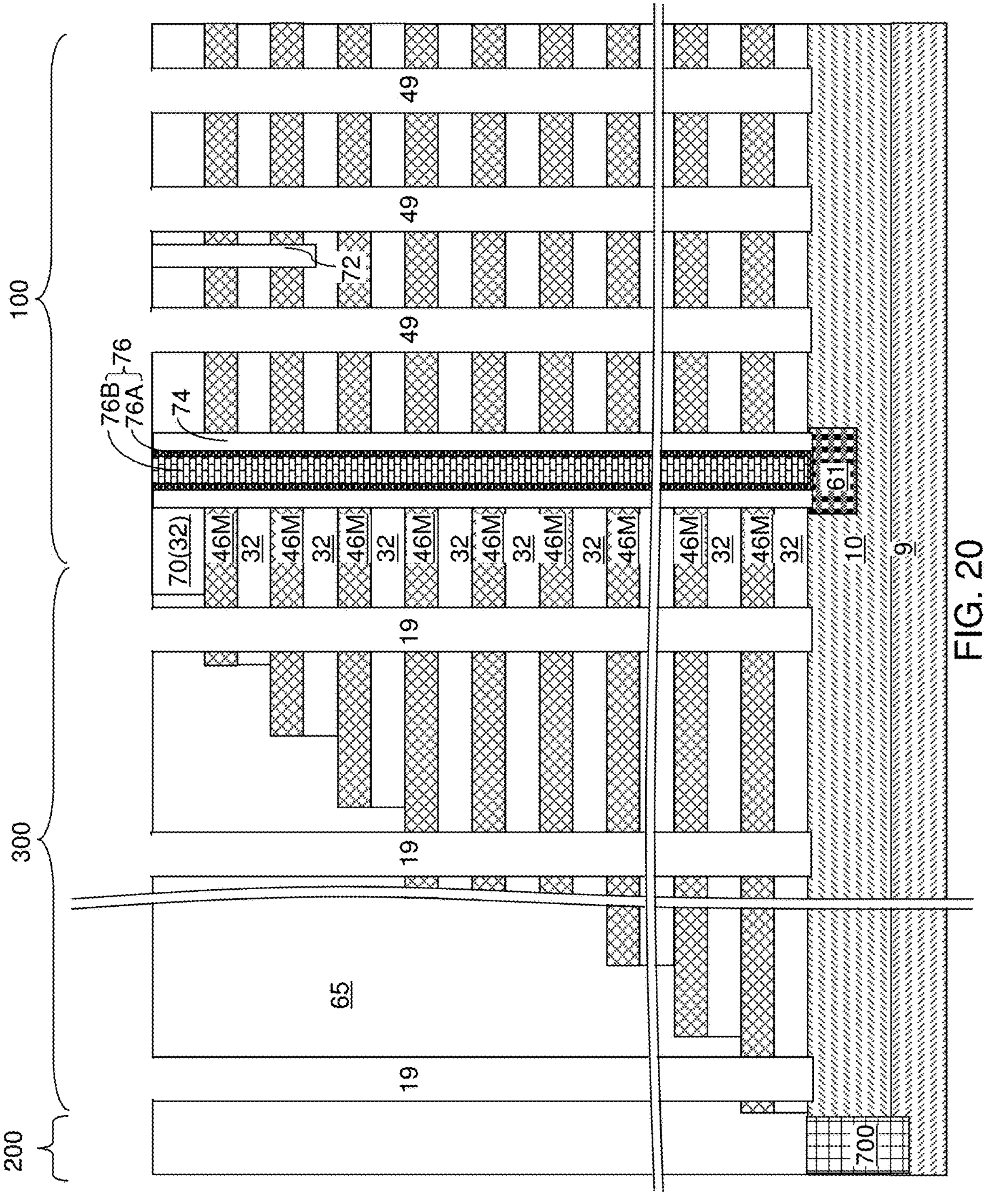
FIG. 20 is a schematic vertical cross-sectional view of the second exemplary structure after removal of the sacrificial memory opening fill structures and sacrificial support opening fill structures according to an embodiment of the present disclosure.

Referring to FIG. 20, the sacrificial fill material of the sacrificial memory opening fill structures 48 and the sacrificial support opening fill structures 18 can be removed selective to the materials of the semiconductor material layer 10, the insulating layers 32, and the molybdenum layers 46M. Voids are formed within the volumes of the memory openings 49 and the support openings 19. A combination of the alternating stack (32, 46M) of the insulating layers 32 and the molybdenum layers 46M and the memory openings 49 is formed over the substrate (9, 10).

Figure 21:
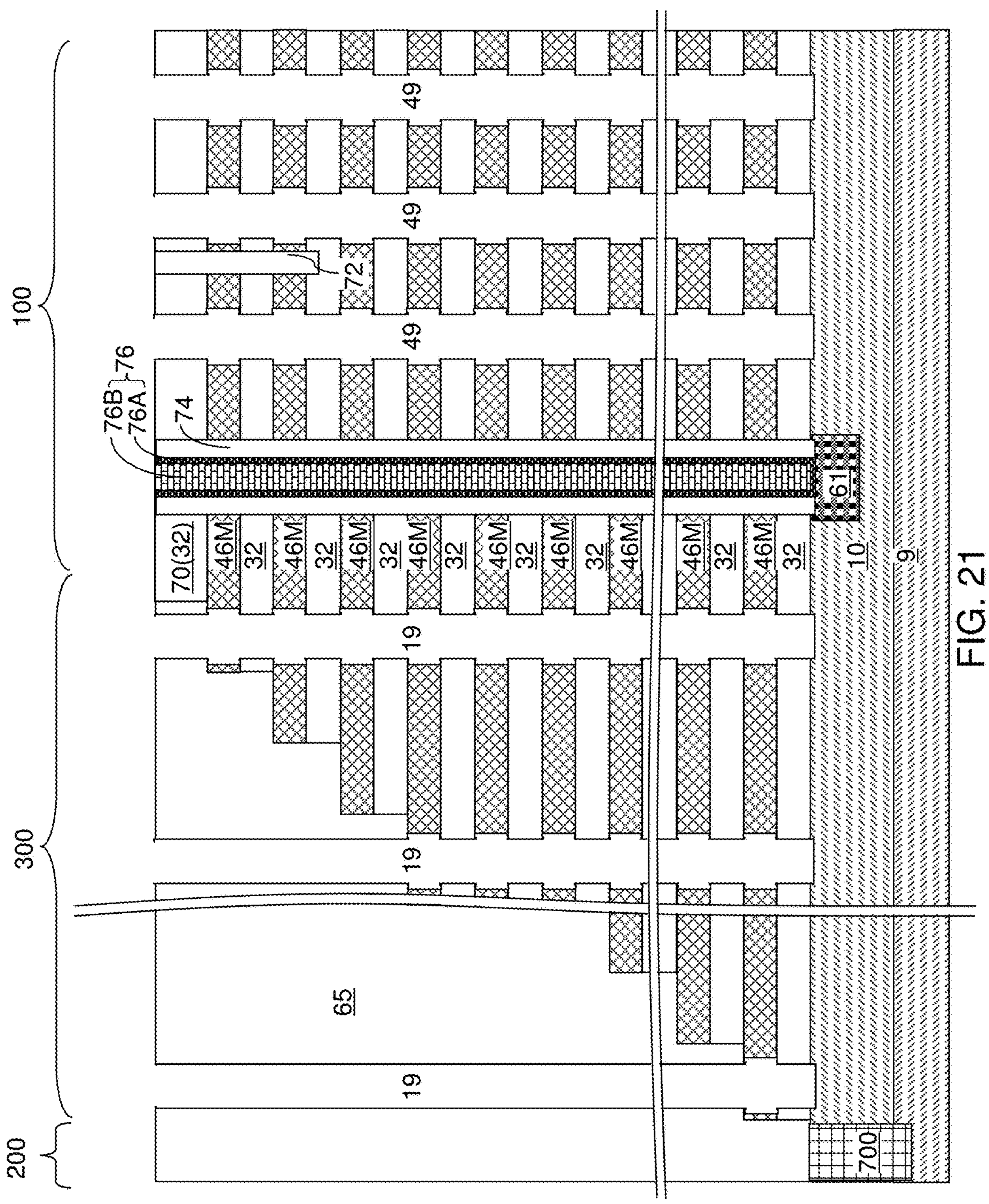
FIG. 21 is a schematic vertical cross-sectional view of the second exemplary structure after laterally recessing the molybdenum layers according to an embodiment of the present disclosure.

Referring to FIG. 21, the processing steps of FIGS. 5A and 5B may be optionally performed to isotropically recess physically exposed surfaces of the molybdenum layers 46M around the memory openings 49 and the support openings 19. A lateral recess 41R (shown in FIG. 5B) can be formed in each volume from which a respective portion of the molybdenum layers 46M is removed by the isotropic etch process. Each lateral recess 41R around a memory opening 49 may have a tubular configuration. The lateral recess distance of the isotropic etch process may be in a range from 3 nm to 100 nm, such as from 6 nm to 30 nm, although lesser and greater recess distances may also be employed. A vertical stack of lateral recesses 41R can be formed around each memory opening 49. The lateral recesses 41R within each vertical stack of lateral recesses 41R around a memory opening 49 can be formed at each level of the molybdenum layers 46M.

Figure 22:
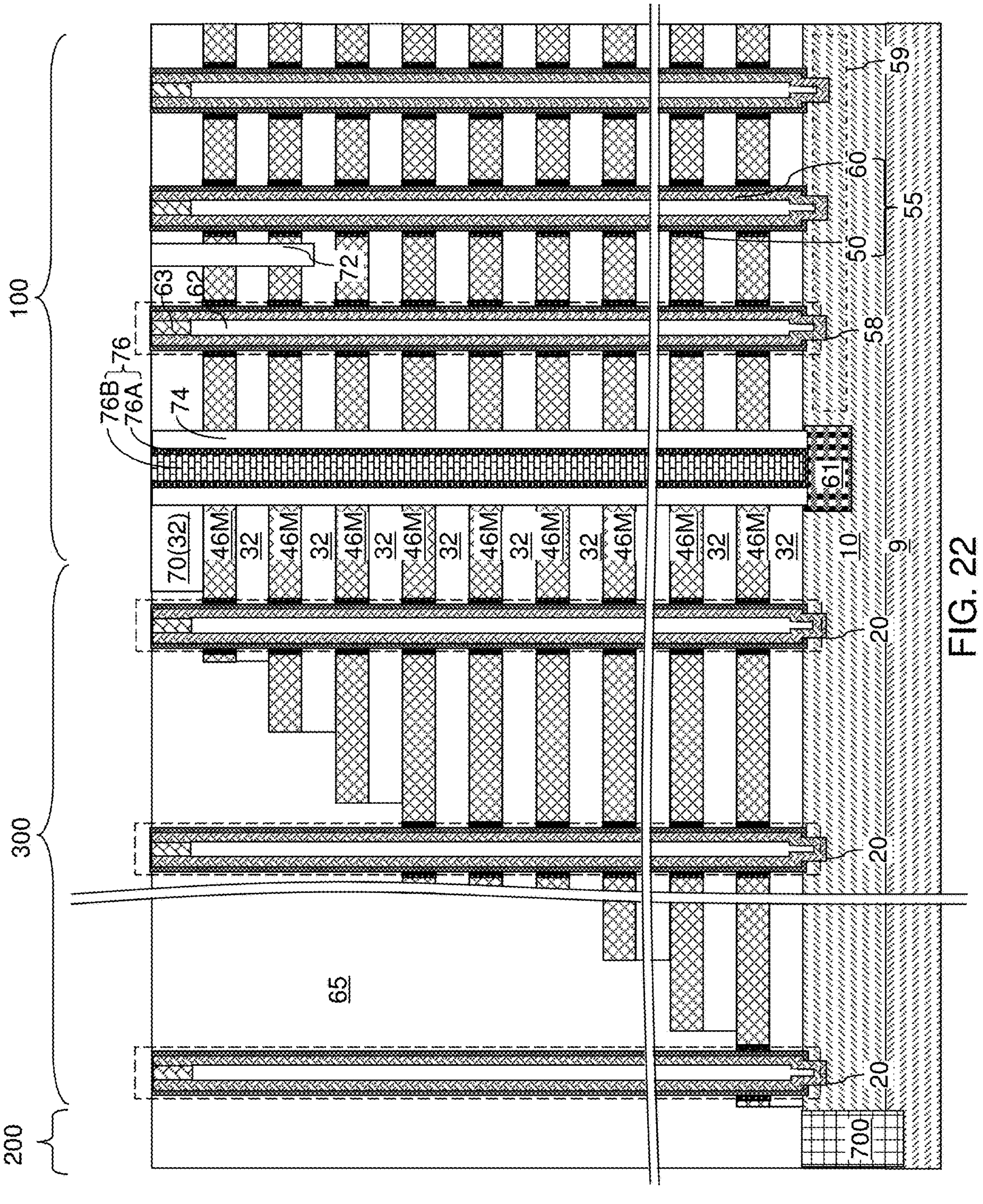
FIG. 22 is a schematic vertical cross-sectional view of the second exemplary structure after formation of memory openings fill structures and support pillar structures according to an embodiment of the present disclosure.

Referring to FIG. 22, a set of processing steps described with reference to FIGS. 6A-6H or a set of processing steps described with reference to FIGS. 7A-7D can be performed to form the conductive capping material portions 46C and then memory opening fill structure 58 within each memory opening 49, and to form a support pillar structure 20 within each support opening 19. Generally, the memory opening fill structures 58 and the support pillar structures 20 may have the first configuration illustrated in FIG. 6H, or may have the configuration illustrated in FIG. 7D.

Figure 23:
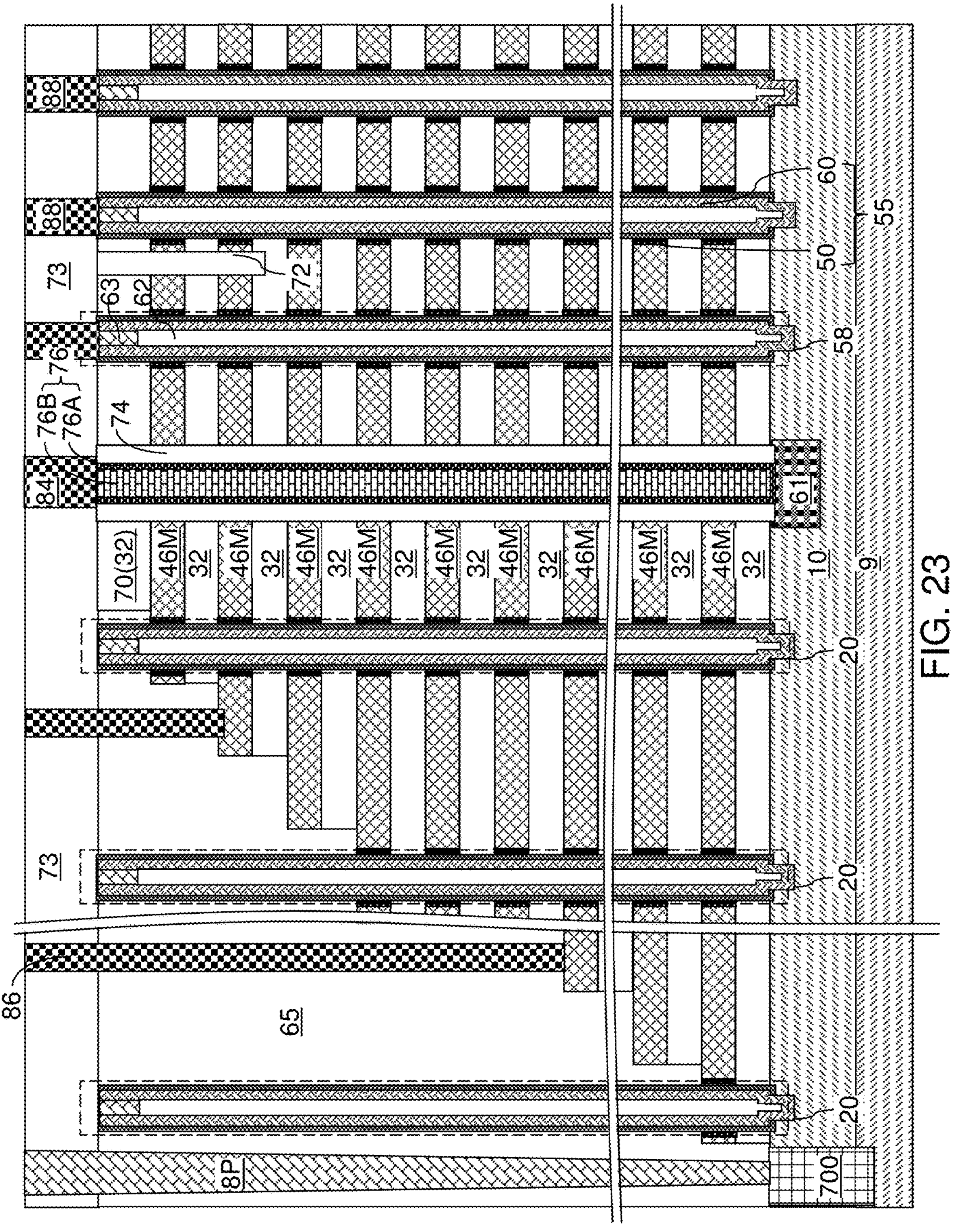
FIG. 23 is a schematic vertical cross-sectional view of the second exemplary structure after formation of additional contact via structures according to an embodiment of the present disclosure.

Referring to FIG. 23, a contact-level dielectric layer 73 may be formed over the insulating cap layer 70 and the retro-stepped dielectric material portion 65. The processing steps described with reference to FIG. 11 can be performed to form various additional contact via structures (88, 86, 8P, 84). The additional contact via structures (88, 86, 8P, 84) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the metal layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices. Backside connection via structures 84 may be formed on a top surface of a respective one of the backside contact via structures 76.

FIGS. 24A-24D are sequential vertical cross-sectional views of a memory opening during formation of a third exemplary structure according to another embodiment of the present disclosure.

Figures 24A, 24B:
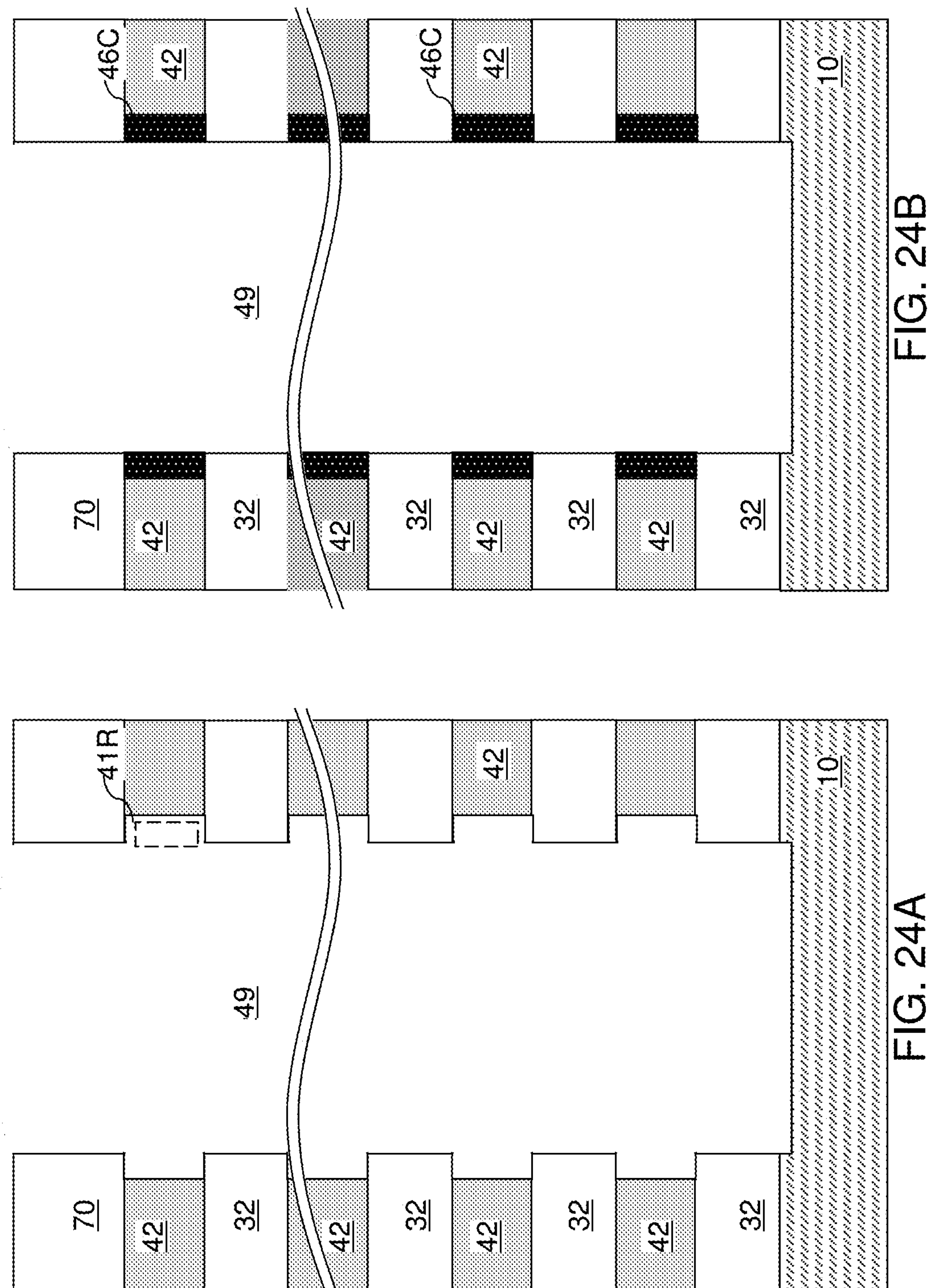
FIGS. 24A-24D are sequential vertical cross-sectional views of a memory opening during formation of a third exemplary structure according to an embodiment of the present disclosure.

The in-process third exemplary structure shown in FIG. 24A corresponds to a portion of the memory opening of the second exemplary structure shown in FIG. 14A with a modification of lateral recesses being present at the levels of the sacrificial material layers 42. Specifically, an isotropic etch may be optionally performed to isotropically recess physically exposed surfaces of the sacrificial material layers 42 shown in FIG. 14A around the memory openings 49 and the support openings 19. For example, a wet etch process having an etch chemistry, such as hot phosphoric acid, that etches silicon nitride selective to the insulating material of the insulating layers 32 and the retro-stepped dielectric material portion 65 can be performed to laterally recess physically exposed sidewalls of the sacrificial material layers 42 around the memory openings 49 and the support openings 19. A lateral recess 41R can be formed in each volume from which a respective portion of the sacrificial material layer 42 is removed by the isotropic etch process.

Referring to FIG. 24B, the conductive capping material portions 46C are selectively grown in the lateral recesses 41R from exposed sidewalls of the sacrificial material layers 42. For example, ruthenium conductive capping material portions 46C can be selectively grown on silicon nitride sacrificial material layers 42 but not on silicon oxide insulating layers 32 using an area selective ALD process. An example of an area selective ALD process which selectively grows ruthenium from silicon nitride is described in U.S. Pat. No. 9,768,270 B2, which is incorporated herein by reference in its entirety.

Figure 24D:
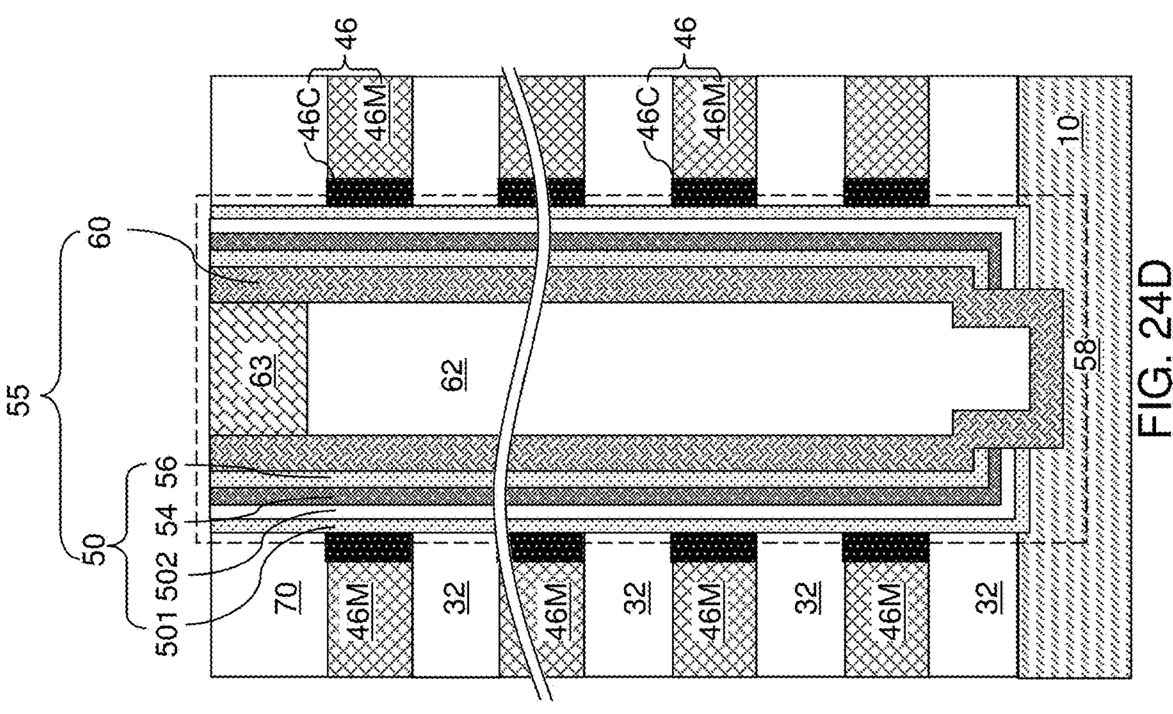
Figure 24C:
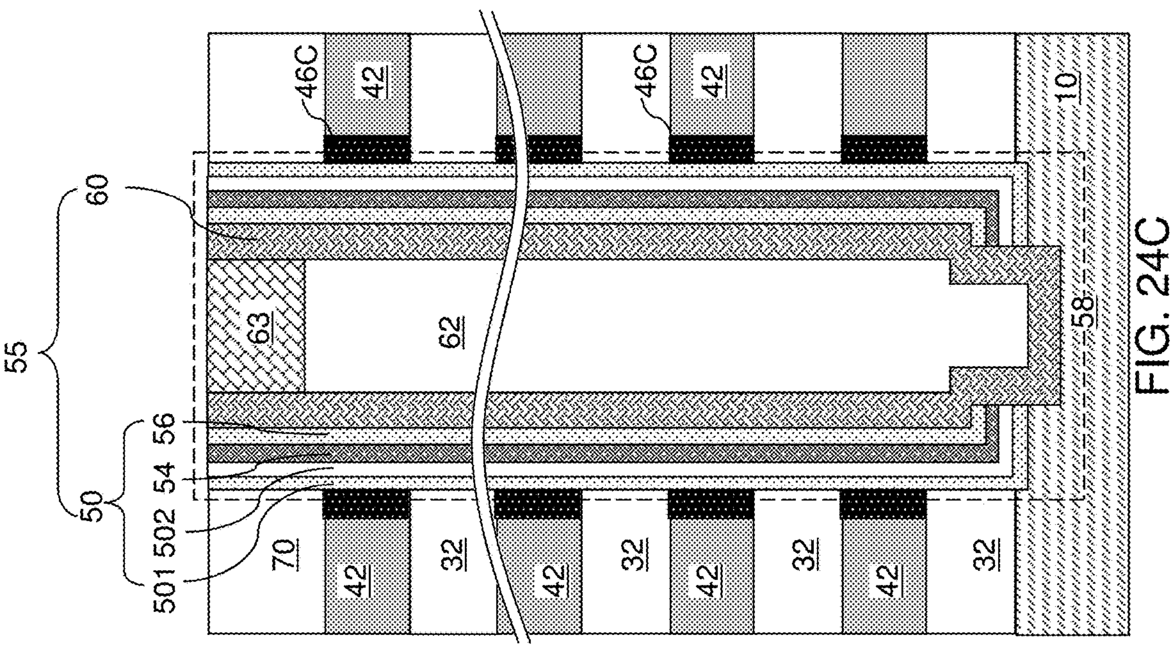

Referring to FIG. 24C, the memory opening fill structures 58 are formed in the memory openings 49 and in contact with the sidewalls of the conductive capping material portions 46C. The memory opening fill structures may be formed using the steps described above with respect to FIGS. 6B to 6H.

Referring to FIG. 24D, the sacrificial material layers 42 are replaced with the molybdenum layers 46M using the steps described above with respect to FIGS. 16, 17 and 18. Thereafter the backside contact via structures 76 can be formed as described above with respect to FIG. 19, and various contact via structures can be formed as described above with respect to FIG. 23.

FIGS. 25A-25D are sequential vertical cross-sectional views of a memory opening during formation of a fourth exemplary structure according to another embodiment of the present disclosure.

Figure 25B:
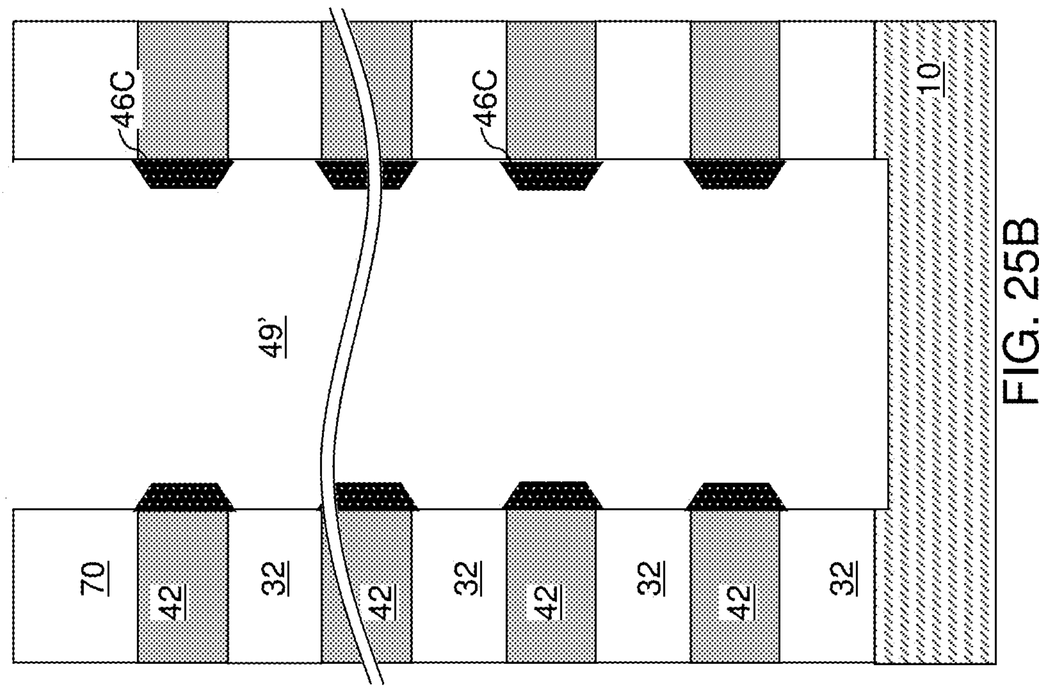
FIGS. 25A-25D are sequential vertical cross-sectional views of a memory opening during formation of a fourth exemplary structure according to an embodiment of the present disclosure.
Figure 25A:
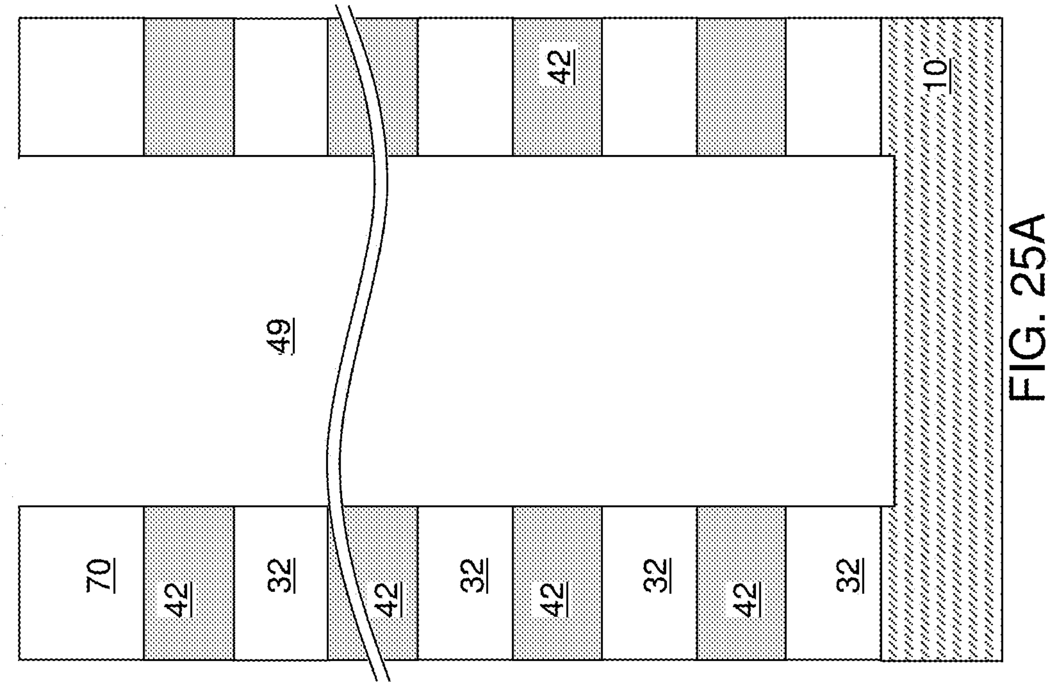

The in-process fourth exemplary structure shown in FIG. 25A corresponds to a portion of the memory opening of the second exemplary structure shown in FIG. 14A.

Referring to FIG. 25B, the conductive capping material portions 46C are selectively grown from exposed sidewalls of the sacrificial material layers 42. For example, ruthenium conductive capping material portions 46C can be selectively grown on silicon nitride sacrificial material layers 42 but not on silicon oxide insulating layers 32 using an area selective ALD process. An example of an area selective ALD process which selectively grows ruthenium from silicon nitride is described in U.S. Pat. No. 9,768,270 B2, which is incorporated herein by reference in its entirety.

Figure 25D:
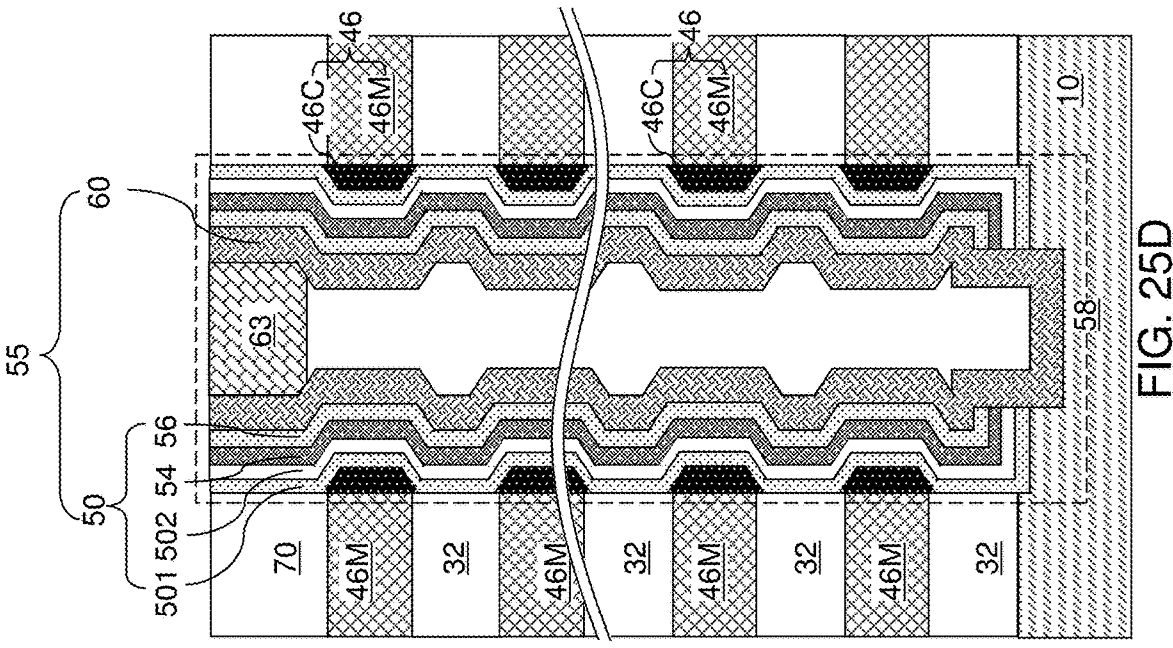
Figure 25C:
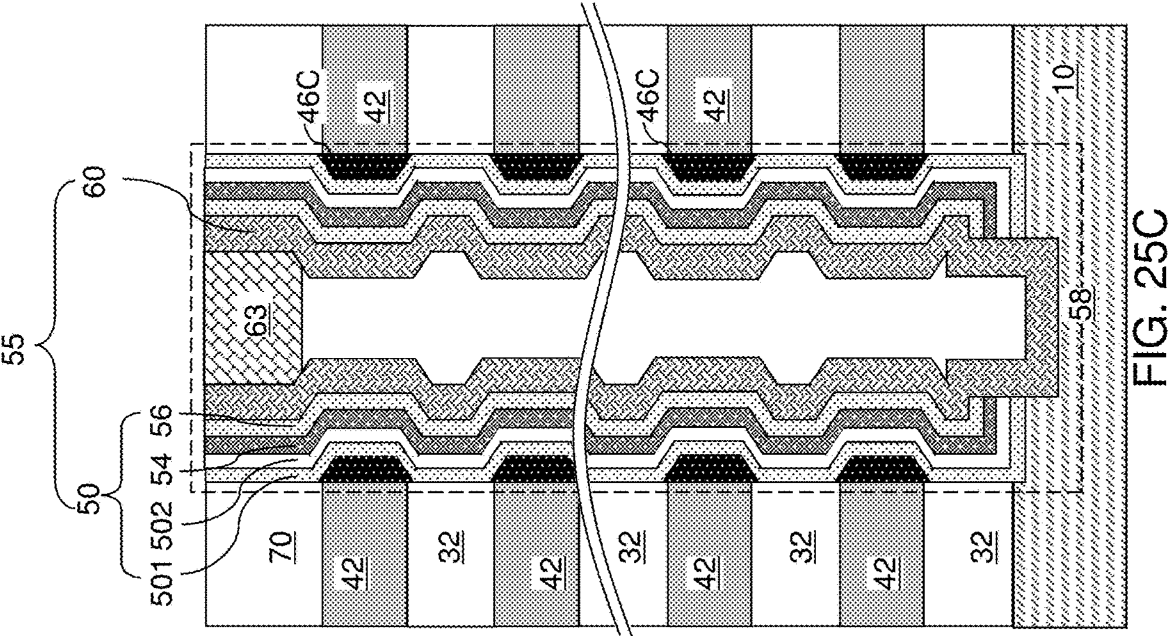

Referring to FIG. 25C, the memory opening fill structures 58 are formed in the memory openings 49 and in contact with the sidewalls of the conductive capping material portions 46C. The memory opening fill structures may be formed using the steps described above with respect to FIGS. 7B to 7D.

Referring to FIG. 25D, the sacrificial material layers 42 are replaced with the molybdenum layers 46M using the steps described above with respect to FIGS. 16, 17 and 18. Thereafter the backside contact via structures 76 can be formed as described above with respect to FIG. 19, and various contact via structures can be formed as described above with respect to FIG. 23.

In the third and fourth exemplary structures, the conductive capping material portions 46C protect the metal oxide blocking dielectric layer 501 from chlorine induced damage by the chlorine used in the molybdenum precursor vapor (e.g., molybdenum oxychloride or molybdenum pentachloride) used deposit the molybdenum layers 46M.

Referring to all drawings and according to various embodiments of the present disclosure, a three-dimensional memory device is provided, which comprises: an alternating stack (32, 46) of insulating layers 32 and electrically conductive layers 46; memory openings 49 vertically extending through the alternating stack (32, 46); and memory opening fill structures 58 located within the memory openings 49, wherein: each of the memory opening fill structures 58 comprises a respective vertical semiconductor channel 60 and a respective vertical stack of memory elements (such as portions of a memory material layer 54 located at levels of the electrically conductive layers 46), and each of the electrically conductive layers 46 comprise a molybdenum layer 46M and a plurality of conductive capping material portions 46C which comprise a material other than molybdenum and which are in contact with an outer sidewall of a respective one of the memory opening fill structures 58.

In one embodiment, the conductive capping material portions 46C comprise, and/or consists essentially of, a conductive metal-containing compound material. In one embodiment, the conductive metal-containing compound material comprises a conductive metal oxide material or a conductive metal nitride material. In one embodiment, the conductive metal-containing compound material is selected from ruthenium nitride, ruthenium oxide, and tungsten nitride.

In one embodiment, the conductive capping material portions 46C consist essentially of an elemental metal. In one embodiment, the conductive capping material portions 46C consist essentially of tungsten or ruthenium. In one embodiment, each of the molybdenum layers 46M is in contact with a respective underlying insulating layer and a respective overlying insulating layer of the insulating layers 32 in the alternating stack (32, 46).

In one embodiment, each of the plurality of conductive capping material portions 46C is in contact with a respective underlying insulating layer 32 and a respective overlying insulating layer 32 of the insulating layers 32 in the alternating stack (32, 46). In one embodiment, each of the plurality of conductive capping material portions 46C is in contact with an annular top surface of the respective underlying insulating layer 32 and is in contact with an annular bottom surface of the respective overlying insulating layer 32. Alternatively or additionally, each of the plurality of conductive capping material portions 46C is in contact with a cylindrical surface segment of the respective underlying insulating layer 32 and is in contact with a cylindrical surface segment of the respective overlying insulating layer 32.

In one embodiment, each of the memory opening fill structures 58 comprises a respective memory film 50 that vertically extends from a topmost layer within the alternating stack (32, 46) to a bottommost layer within the alternating stack (32, 46); and the respective vertical stack of memory elements comprises portions of the respective memory film 50 located at levels of the electrically conductive layers 46.

In one embodiment, the respective memory film 50 comprises a respective set of at least one blocking dielectric layer (501, 502) that laterally surrounds the respective vertical stack of memory elements; and the respective set of at least one blocking dielectric layer (501, 502) comprises an outer sidewall that contacts each of the insulating layers 32 within the alternating stack (32, 46) and contacts each of the electrically conductive layers 46 within the alternating stack (32, 46). In one embodiment, the respective set of at least one blocking dielectric layer comprises (501, 502) a layer stack that comprises: a dielectric metal oxide blocking dielectric layer 501 in contact with each of the insulating layers 32 within the alternating stack (32, 46) and within each of the electrically conductive layers 46 within the alternating stack (32, 46); and a silicon oxide blocking dielectric layer 502 in contact with the respective vertical stack of memory elements.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:

an alternating stack of insulating layers and electrically conductive layers;

memory openings vertically extending through the alternating stack; and memory opening fill structures located within the memory openings, wherein:

each of the memory opening fill structures comprises a respective vertical semiconductor channel and a respective vertical stack of memory elements;

each of the electrically conductive layers comprise a molybdenum layer and a plurality of conductive capping material portions which comprise a material other than molybdenum and which are in contact with an outer sidewall of a respective one of the memory opening fill structures, and each of the conductive capping material portions comprises a respective outer sidewall that contacts the molybdenum layer and that is located within a respective vertical plane including a respective set of vertical interfaces between the insulating layers and the respective one of the memory opening fill structures;

the alternating stack is located over a top surface of a substrate;

each of the memory opening fill structures comprises a respective memory film that vertically extends from a topmost layer within the alternating stack to a bottommost layer within the alternating stack; and each of the memory elements of the respective vertical stack of memory elements comprises a respective portion of the respective memory film located at a same vertical distance from the top surface of the substrate as a respective one of the electrically conductive layers.

2. The three-dimensional memory device of claim 1, wherein:

the respective memory film comprises at least one blocking dielectric layer that laterally surrounds the respective vertical stack of memory elements; and the at least one blocking dielectric layer comprises an outer sidewall that contacts each of the insulating layers within the alternating stack and contacts each of the electrically conductive layers within the alternating stack.

3. The three-dimensional memory device of claim 2, wherein the at least one blocking dielectric layer comprises:

a dielectric metal oxide blocking dielectric layer in contact with each of the insulating layers within the alternating stack and within each of the electrically conductive layers within the alternating stack; and a silicon oxide blocking dielectric layer in contact with the respective vertical stack of memory elements.

4. A three-dimensional memory device, comprising:

an alternating stack of insulating layers and electrically conductive layers;

memory openings vertically extending through the alternating stack; and memory opening fill structures located within the memory openings, wherein:

each of the memory opening fill structures comprises a respective vertical semiconductor channel and a respective vertical stack of memory elements;

each of the electrically conductive layers comprise a molybdenum layer and a plurality of conductive capping material portions which comprise a material other than molybdenum and which are in contact with an outer sidewall of a respective one of the memory opening fill structures, and each of the conductive capping material portions comprises a respective outer sidewall that contacts the molybdenum layer and that is located within a respective vertical plane including a respective set of vertical interfaces between the insulating layers and the respective one of the memory opening fill structures; and each of the plurality of conductive capping material portions comprises a respective inner sidewall that laterally protrudes inward relative to the respective vertical plane and in direct contact with the respective one of the memory opening fill structures.

5. The three-dimensional memory device of claim 4, wherein the respective inner sidewall is in direct contact with a blocking dielectric layer within the respective one of the memory opening fill structures.

* * * * *